(12) United States Patent
Kimura

(10) Patent No.: US 6,600,512 B1
(45) Date of Patent: Jul. 29, 2003

(54) COLOR LINEAR IMAGE SENSOR HAVING SMALL LINE-TO LINE DISTANCE AND ITS DRIVING METHOD

(75) Inventor: Tetsuji Kimura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/225,556

(22) Filed: Jan. 5, 1999

(30) Foreign Application Priority Data

Jan. 5, 1998 (JP) .......................................... 10-000437

(51) Int. Cl.[7] .......................... H04N 3/14; H04N 5/335; H04N 9/04; H04N 9/088
(52) U.S. Cl. ........................ 348/283; 257/234; 257/230; 257/229; 257/231; 358/483
(58) Field of Search ................................ 348/272, 282, 348/283, 294, 311; 257/234, 229, 230, 231; 358/483

(56) References Cited

U.S. PATENT DOCUMENTS

| | | | | |
|---|---|---|---|---|
| 4,389,661 A | * | 6/1983 | Yamada | 257/223 |
| 4,980,735 A | * | 12/1990 | Yamawaki | 257/222 |
| 4,984,047 A | * | 1/1991 | Stevens | 257/223 |
| 5,053,872 A | * | 10/1991 | Matsunaga | 257/225 |
| 5,703,640 A | * | 12/1997 | Miwada | 257/232 |
| 5,874,993 A | * | 2/1999 | Ciccarelli et al. | 348/294 |
| 6,169,576 B1 | * | 1/2001 | Monoi | 348/272 |

FOREIGN PATENT DOCUMENTS

JP           8-10760       *   1/1996

* cited by examiner

*Primary Examiner*—Wendy R. Garber
*Assistant Examiner*—James M Hannett
(74) *Attorney, Agent, or Firm*—Sughrue Mion, PLLC

(57) ABSTRACT

Disclosed is a color linear image sensor having a small line-to-line distance, which comprises signal charge storage sections adjacent to light receiving sections. Signal charges are read by signal charge reading sections from the signal charge storage sections to signal charge transfer sections, and thereby residual images are prevented from being generated. Each of the signal charge reading sections is electrically connected with a portion of the signal charge transfer section which is adjacent to the signal charge reading section, and driving pulses are made common ($\phi 1$ (TG)). Alternatively, each of the signal charge storage sections is electrically connected with a portion of the signal charge transfer section which is not adjacent to the signal charge reading section, and driving pulses are made common (($\phi 2$ (ST)). Accordingly, the number of wiring lines (pulse lines) arranged between the light receiving sections of respective colors is reduced by one. Therefore, without greatly increasing a distance (line-to-line distance) between the light receiving sections of three RGB colors, residual images are suppressed.

13 Claims, 21 Drawing Sheets

FIG. 5
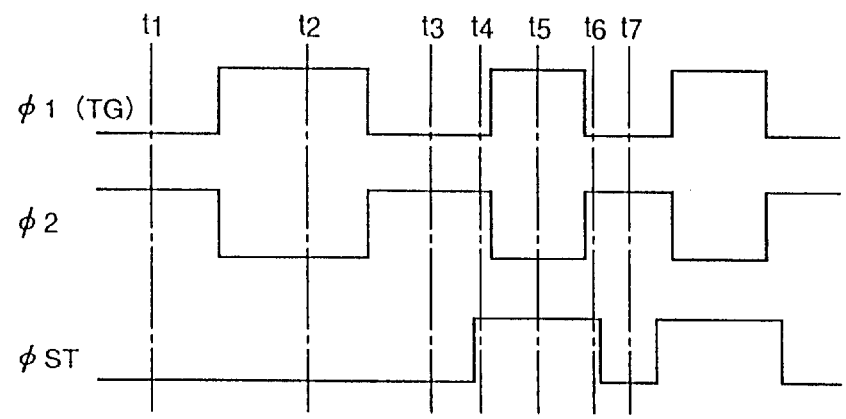
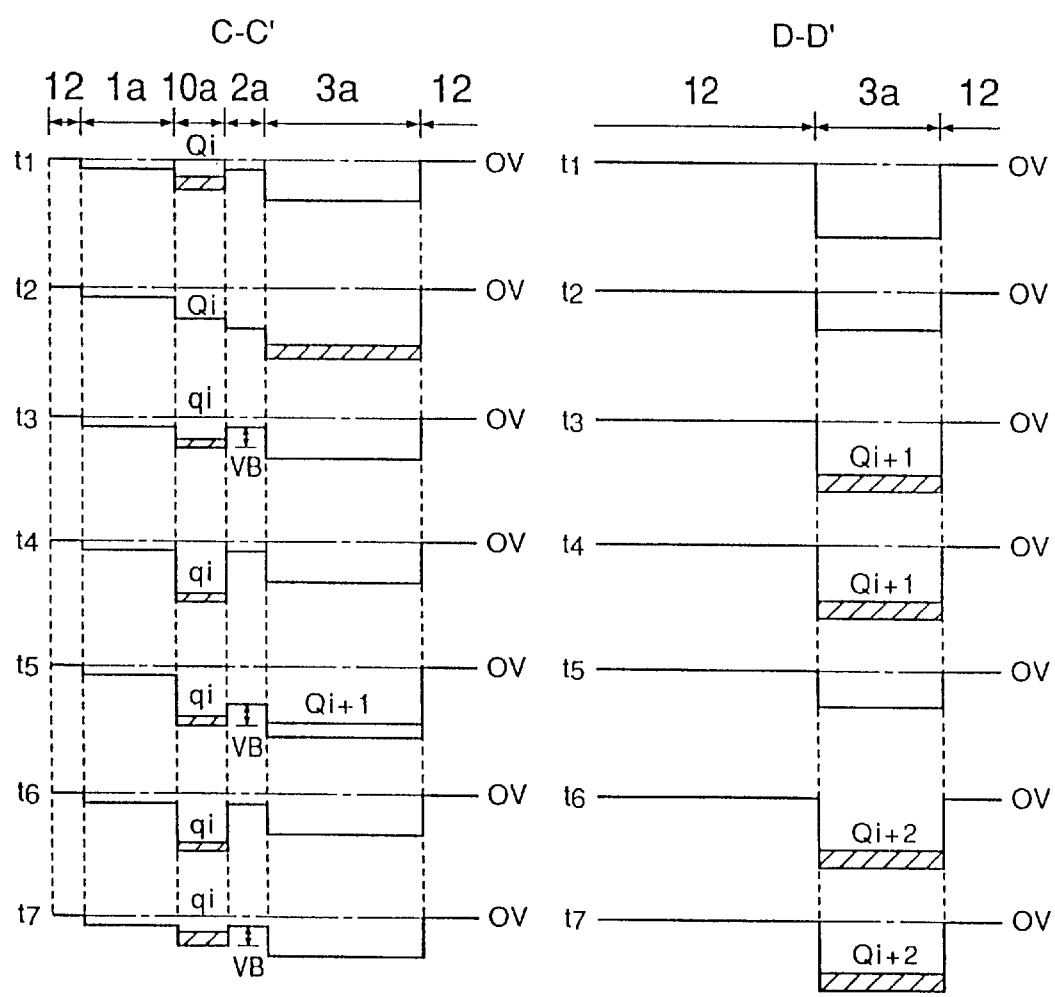

FIG. 10
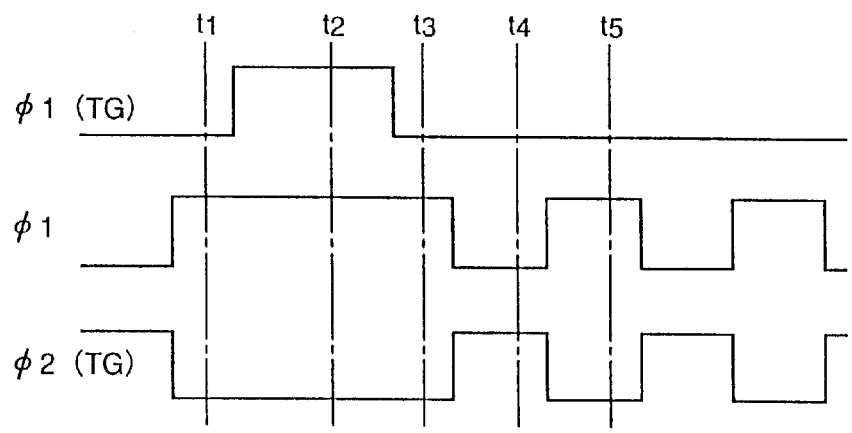
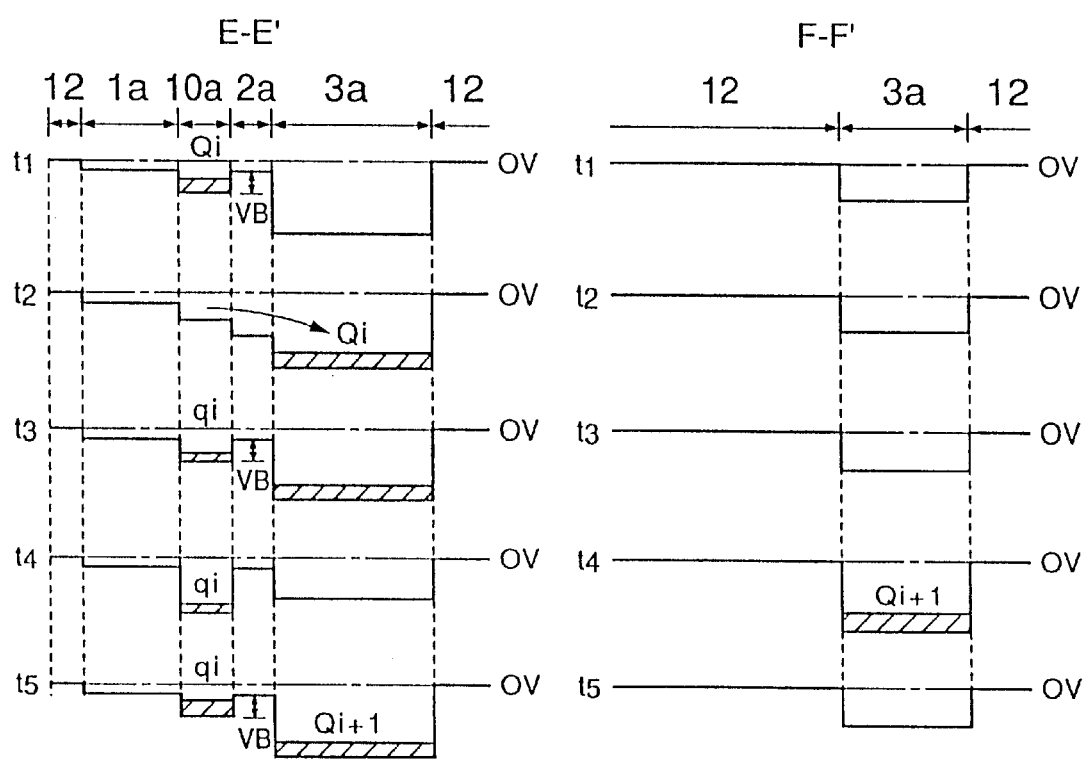

COLOR LINEAR IMAGE SENSOR HAVING SMALL LINE-TO LINE DISTANCE AND ITS DRIVING METHOD

BACKGROUND OF THE INVENTION

1. Field of the Invention

The present invention relates to a color linear image sensor and driving method, and more particularly to a color linear image sensor and its driving method for reducing residual images without greatly increasing a line-to-line distance of the color linear image sensor.

2. Description of the Related Art

With popularization of personal computers and requests for higher performance of copying machines in recent years, demands for color linear image sensors for reading color images have increased.

Such a color linear image sensor is usually constructed in a manner that three CCD linear image sensors having charge transfer functions are arranged in parallel and color filters having different colors, e.g., R (red), G (green) and B (blue) filters, are placed on the light receiving section array of each CCD linear image sensor.

FIG. 11 is an entire constitutional view showing an example of such a color linear image sensor.

In FIG. 11 reference numerals 1a, 1b and 1c denote light receiving sections having color filters of RGB (not shown) placed thereon; and 2a, 2b and 2c denote signal charge reading sections for reading signal charges stored after photoelectric conversion in the light receiving sections to signal charge transfer sections 3a, 3b and 3c provided in the vicinity. Signal charges Q1, Q2 and Q3 of the respective light receiving sections are read to the signal charge transfer sections (indicated by white arrows. Reading pulses are $\phi$TG1, 2 and 3. Pulse lines are not shown).

In the case of the CCD linear image sensor, the signal charge transfer sections 3a, 3b and 3c usually include two-phase driven CCD shift registers, and pulse lines L1, L2, L3, L4 and L5 (clock pulse is $\phi$1 or $\phi$2; connection from the pulse line to each signal charge transfer section is indicated by an arrow) for driving the two-phase driven CCD shift registers are arranged in the vicinity of the signal charge transfer sections.

Signal charges transferred by the signal charge transfer sections 3a, 3b and 3c are outputted to the outside by output circuits 4a, 4b and 4c composed of signal charge detection sections including a floating diffusion region for converting the signal charges into signal voltages and analog circuits such as source followers or inverters, and then color signals are obtained.

FIG. 15 is a timing chart showing a driving method of the conventional color linear image sensor shown in FIG. 11. (Common among colors).

The signal charges of the light receiving sections 1a, 1b and 1c are stored while clock pulses $\phi$TG1, 2 and 3 applied to the signal charge reading sections 2a, 2b and 2c are at LOW levels. In the period T when the clock pulses are at HIGH levels, the signal charges are read to the specified signal charge transfer sections 3a, 3b and 3c.

Subsequently, in these signal charge transfer sections, the signal charges are transferred by two-phase clock pulses $\phi$1 and $\phi$2 (phases reverse to each other), and then outputted from the output circuits 4a, 4b and 4c.

If the foregoing color linear image sensor is used for a scanner or a copying machine, scanning is performed by the three CCD linear image sensors having the color filters vertically to the arraying direction thereof. Accordingly, for obtaining color information (e.g., RGB) regarding an image of a specified place on an object, signal processing must be performed after externally storing bits of color information of first and second lines in the period from the end of scanning the specified place by the first line (e.g., R) to the end of scanning by a third line (e.g., B) and then obtaining three bits of color information. Consequently, an external memory having a very large capacity must be used.

For example, in the case of a color linear image sensor of a class of 5300 pixels×3 array which is used for a color copying machine or a high resolution color scanner, if gradation is set to 10 bits, a necessary capacity C of an external memory is obtained by the following expression:

$$C=5300\times10\times3\times(M+1) \text{ bits} \tag{1}$$

Herein, M denotes, in the form of a scanning number of times, a line-to-line distance between two light receiving section array adjacent to each other among the light receiving section array. For example, if a size of one pixel of each of the R, G and B light receiving sections is 8 $\mu$m×8 $\mu$m and line-to-line distances between the R and G light receiving section array and between the G and B light receiving section array are both 64 $\mu$m, M is obtained by the following expression:

$$M=64 \ \mu\text{m}/8 \ \mu\text{m} \tag{2}$$

Accordingly, a capacity C of the external memory is 1431000 bits.

As apparent from the expression (1), for reducing a capacity of the external memory, it is necessary to reduce a scanning number of times in the period from the end of scanning by the first line (e.g., R) to the end of scanning by the third line (e.g., B) by shortening a distance among the three light receiving section array.

FIG. 12 is an expanded view of a region surrounded with a broken line X1 of FIG. 11. In the drawing, the same reference numerals as those used in FIG. 11, e.g., 1a and 1b, denote the same elements. A reference numeral 5 denotes an aluminum wiring line to which a two-phase clock pulse $\phi$1 or $\phi$2 is applied; 6 a contact for connecting the aluminum wiring line 5 with one selected from two kinds of polycrystalline silicon electrodes 11a and 11b of the CCD shift register which constitutes the signal charge transfer section 3a; 7 also a contact for connecting together the two kinds of polycrystalline silicon electrodes 11a and 11b of the CCD shift register; 8 an aluminum wiring line to which clock pulses for driving the signal charge reading sections 2a and 2b are applied; 9 a contact for connecting the aluminum wiring line 8 with polycrystalline silicon electrodes 11b for constituting the signal charge reading sections 2a and 2b; and 12 an element separation region for separating each pixel of the light receiving section and the signal charge transfer section.

A size of one pixel of the light receiving section is determined by a portion held between the aluminum wiring lines 5 and 8.

Light shielding of the signal charge transfer section 3a is usually performed by another kind of aluminum wiring line, but its explanation will be omitted.

As apparent from FIG. 12, main factors for deciding a line-to-line distance (distance from the center of the light receiving section 1a to the center of the light receiving section 1b) are as follows:

(1) a size of one pixel of the light receiving section;

(2) a size of the signal charge reading section;
(3) a size of the signal charge transfer section; and
(4) a size of the element separation region between the signal charge transfer section and its adjoining light receiving section array (including a size of the pulse line). In the example of FIG. 12, a line-to-line distance is totally 64 μm (M=8), which is obtained by adding up the following sizes: a size of one pixel of the light receiving section is 8 μm; a size of the signal charge reading section is 10 μm; a size of the signal charge transfer section is 18 μm; a size of the element separation region between the signal charge transfer section and its adjoining light receiving section array is 25 μm; and a size of a connected part between (2) and (3) is 3 μm.

Regarding the foregoing factors (1) to (4), for (1), its size cannot be changed, because it is a fixed pixel size. For (2), it is very difficult to set its size to be lower than 10 μm, because a region must be provided for connecting a clock wiring line for driving the signal charge reading section with a polycrystalline silicon electrode for constituting the signal charge reading section. For (3), easy reduction in size of this portion will cause characteristic deterioration, because as this size is reduced, a maximum signal charge amount processed by the signal charge transfer section is reduced more and a dynamic range for output signals is also reduced more. For (4), it is very difficult to change (reduce) its size, because as in the case of (2), a very large region (about 25 μm) must be provided for connecting the aluminum wiring line 5 as a pulse line on the element separation region 12 with one 11b selected from the two kinds of polycrystalline silicon electrodes of the signal charge transfer section 3a by the contact 6 and also connecting together the two kinds of polycrystalline silicon electrodes 11a and 11b by the contact 7.

In other words, size changes are difficult for any of the factors (1) to (4). In the color linear image sensor shown in FIG. 11, the line-to-line distance having the value shown as an example is substantially a current minimum.

With the color linear image sensor constructed in the foregoing manner, while the signal charges stored in the respective light receiving sections are read by the signal charge reading sections to the specified signal charge transfer sections, some signal charges are left unread (left untransferable). Consequently, a problem of residual images is created. Next, this problem will be described with reference to the accompanying drawings.

FIG. 13 is a sectional view taken along a line A—A of the conventional example of FIG. 12. In the drawing, the same reference numerals as those used in FIG. 12 denote the same elements. Other constituting elements will now be described based on a manufacturing process.

A reference numeral 13 denotes an N-type semiconductor substrate. A P well 14 is first formed on this N-type semiconductor substrate 13 by ion-implanting P-type impurities such as boron and then performing thermal diffusion. Subsequently, an N-type region 15 is formed by ion-implanting N-type impurities such as phosphorus or boron and then performing thermal diffusion. Likewise, an N-type region 17 is formed by ion-implanting N-type impurities such as phosphorus or boron and then performing thermal diffusion. Then, an element separation region 12 is formed by ion-implanting P-type impurities, and reference voltages (0V) are taken in from the outside for the element separation region 12 and the P well 14.

Reference numerals 11a and 11b denote polycrystalline silicon electrodes, which are pattern-formed on the wafer by using a thermal oxidized film 18 as an insulating film after the formation of the element separation region 12. A reference numeral 16 denotes a P-type region for constituting the light receiving section, which is formed, after the formation of the polycrystalline silicon electrode 11b, by performing ion implantation with this polycrystalline silicon electrode 11b as a mask and in self-alignment with the same. Here, incident lights are subjected to photoelectric conversion by a PN junction constituted by the P-type region 16, the N-type region 15 and the P well 14, and thus an operation of the light receiving section is realized. In addition, a buried channel type transistor is composed of the P well 14, the N-type region 17, the thermal oxidized film 18, and the polycrystalline silicon electrode 11a, and thereby the signal charge transfer section 3a is constituted. A reference numeral 20 denotes a flattening film necessary for patterning the aluminum wiring lines 5 and 8.

FIG. 14 shows channel potentials for the light receiving section 1a, the signal charge reading section 2a, the signal charge transfer section 3a, and so on, of FIG. 13. In the drawing, TGoff indicated by a dotted line and TGon indicated by a solid line represent channel potentials for the respective sections at the time of TGoff and TGon of the timing chart shown in FIG. 15.

As apparent from the channel potentials of FIG. 14, signal charges Q are always passed through a portion 2a1 of the signal charge reading section 2a where the N-type region 15 exists when the signal charges Q stored in the light receiving section 1a are transferred (read) therefrom to the signal charge transfer section 3a. A channel potential of this portion is higher than a channel potential of a portion 2a2 of the signal charge reading section where the N-type region does not exist but the P well 14 exists. Consequently, some signal charges are left untransferable (left unread) ΔQ in the portion 2a1. These signal charges left untransferable ΔQ will cause generation of residual images during signal charge reading of next time and thereafter, because they are read bit by bit.

For eliminating such signal charges left untransferable ΔQ, it is possible to employ a structure like that shown in FIG. 16 where the N-type region 15 is separated from the polycrystalline silicon electrode 11b of the signal charge reading section 2a and thereby the N-type region 15 is prevented from existing in the signal charge reading section 2a. Even in the case of this structure, however, since the P-type region 16 is formed in self-alignment with the polycrystalline silicon electrode 11b of the signal charge reading section 2a as described above, a portion 1a1 having the P-type region 16 but not the N-type region 15 is always created in the light receiving section 1a. Consequently, transfer of signal charges from the light receiving section 1a to the signal charge reading section 2a will be impeded. This situation is shown in FIG. 17. FIG. 17 shows channel potentials for the light receiving section 1a, the signal charge reading section 2a and the signal charge transfer section 3a, and so on, of FIG. 16. In the drawing, TGoff indicated by a dotted line and TGon indicated by a solid line represent channel potentials of the respective sections at the time of TGoff and TGon of the timing chart of FIG. 15. As apparent from the channel potentials of FIG. 15, a channel potential is 0V in a portion 1a1 of the light receiving section 1a where the P-type region 16 exists but the N-type region 15 does not exist. Consequently, since the light receiving section is not dependent on a value of a pulse applied to the signal charge reading section 2a, the signal charges Q cannot be read therefrom to the signal charger transfer section.

For the purpose of solving the problems of signal charges left untransferable from the signal charge reading section to the signal charge transfer section and residual images thereby generated, an example realized by using a structure different from that shown in FIG. 13 was disclosed in Patent Publication Hei 8(1996)-10760. FIGS. 18 and 19 are views respectively showing FIGS. 6 and 7 of Patent Publication Hei 8(1996)-10760 referenced herein. But in FIGS. 18 and 19, a number 100 is added to each reference numeral of FIGS. 6 and 7 of Patent Publication Hei 8(1996)-10760. This example of the related art is different from the foregoing conventional example in that a photoelectric conversion section 112 equivalent to the light receiving section 1a of the example shown in FIG. 13 and a charge storage section 113 are separated from each other, and this charge storage section 113 is arranged between the photoelectric conversion section 112 and a transfer gate section 114. A P-type region 104 for constituting the photoelectric conversion section 112 and a P-type region 105 for constituting the transfer gate section 114 are formed in self-alignment respectively with a storage gate electrode 107 and storage gate and transfer gate electrodes 107 and 108. Accordingly, as shown in FIG. 19, in a region from the photoelectric conversion section 112 to below a gate electrode 109-1a of a CCD shift register, no portions exist where a channel potential well (e.g., the portion 2a1 of FIG. 14) or a channel potential barrier (e.g., the portion 1a1 of FIG. 17) is formed. Therefore, no signal charges are left untransferable, and no residual images are generated. In this example of the related art, a negative voltage (e.g., −8V) sufficient for setting a potential of a substrate surface below the storage gate electrode 107 equal to a substrate potential (e.g., 0V) is applied to the storage gate electrode 107. This is for the reason that for smoothly transferring signal charges from the photoelectric conversion section 112 to below the gate electrode 109-1a of the CCD shift register, a channel potential $\Phi ST$ below the storage gate is set deeper than a channel potential $\Phi PD$ of the photoelectric conversion section 112 and shallower than a channel potential $\Phi TGH$ below the transfer gate electrode 108 when an H level potential is applied to the same. It is therefore apparent that as long as each of the channel potentials ($\Phi PD$, $\Phi ST$ and $\Phi TGH$) satisfies $\Phi TGH > \Phi ST > \Phi PD$, a potential applied to the storage gate electrode 107 or the transfer gate electrode 108 can be arbitrarily changed.

However, if the foregoing color linear image sensor is constructed by using the structure of this example of the related art, a line-to-line distance is increased much more compared with that of the conventional color linear image sensor shown in FIGS. 11 and 12. This problem will now be described with reference to the accompanying drawings.

FIG. 20 is an entire constitutional view showing an example of a color linear image sensor constructed by using a linear image sensor of the structure shown in the example of the related art. In the drawing, the same reference numerals as those used in FIG. 11 denote the same elements. In FIG. 20, reference numerals 10a to 10c denote signal charge storage sections to which DC voltages VST are applied. Reference numerals L6 to L11 denote pulse lines for driving the CCD shift registers of the signal charge transfer sections 3a to 3c. (Clock pulse is φ1 or φ2: connection from the pulse line to each signal charge transfer section is indicated by an arrow).

As can be understood from comparison between FIGS. 20 and 11, a difference in structure between the color linear image sensor of this example and that of the conventional example shown in FIG. 11 is dependent on, in addition to the existence of the signal charge transfer sections respectively adjacent to the light receiving sections of respective colors, the existence of only one or two pulse lines for driving the CCD shift register of the signal transfer section, e.g., 3a, between the color light receiving sections adjacent to each other, e.g., 1a and 1b. For further clarifying this difference, comparison will be made between FIG. 12 and FIG. 21 which is an expanded view of a region surrounded with a broken line X2 of FIG. 20.

In FIG. 21, the same reference numerals as those used in FIGS. 12 and 20 denote the same elements. In FIG. 12, the polycrystalline silicon electrode 11a selected from the two kinds of polycrystalline silicon electrodes 11a and 11b for constituting the signal charge transfer section 3a and adjacent to the polycrystalline silicon electrode 11b of the signal charge transfer section 2a is connected, by the contact 7, with another polycrystalline silicon electrode 11b on a channel stop 12 in a side of the signal charge transfer section 3a where the light receiving section 1a does not exist. This polycrystalline silicon electrode 11b is connected, by the contact 6, with the aluminum wiring line 5 of the pulse line L2 to which a clock pulse φ1 is applied. For the remaining polycrystalline silicon electrodes 11a and 11b for constituting the signal charge transfer section 3a, the aluminum wiring line 5 of the pulse line L1 (clock pulse is φ2) arranged in a side of the light receiving section 1a where the signal charge transfer section 3a does not exist is connected with the polycrystalline silicon electrode 11a by the contact 6. This polycrystalline silicon electrode 11a itself is passed on the channel stop 12 as a wiring line from the pulse line L1 to the signal charge transfer section 3a and then connected with the polycrystalline silicon electrode 11a of the signal charge transfer section 3a. This polycrystalline electrode 11a is then connected, by the contact 7, with the remaining polycrystalline silicon electrode 11b on the channel stop 12 in the side of the signal charge transfer section 3a where the light receiving section 1a does not exist. It should be noted that the polycrystalline silicon electrode 11a can be directly connected with the polycrystalline silicon electrode 11a of the signal charge transfer section 3a after being passed from the pulse line L1 on the channel stop 12 because the polycrystalline silicon electrode 11b of the signal charge reading section 2a and the polycrystalline silicon electrode 11b intersecting the former on the channel stop 12 are not identical polycrystalline silicon electrodes. For the light receiving sections 1b and 1c of the other two colors, the signal charge reading sections 2b and 2c and the signal charge transfer sections 3b and 3c, one (11b) selected from the two kinds of polycrystalline silicon electrodes can also be passed as a wiring line on the channel stop 12 for separating each pixel of the light receiving section. Accordingly, in this conventional example, it is only necessary to arrange one pulse line between the light receiving sections adjacent to each other, to which clock pulse φ2 is applied.

On the other hand, in the case of the color linear image sensor shown in FIG. 21, different from the example of FIG. 12, a signal charge storage section 10a is provided between the light receiving section 1a and the signal charge reading section 2a. For a polycrystalline silicon electrode for constituting this signal charge storage section 10a, one identical to the polycrystalline silicon electrode 11b of the signal charge reading section 2a cannot be used (if an identical electrode is used, short-circuiting or a gap may apparently occur between both). Thus, of the two kinds of polycrystalline silicon electrodes, a remaining one 11a must be used. Therefore, different from the example of FIG. 12, a pulse line to which a clock pulse φ2 is applied cannot be arranged in a side of the light receiving section where the signal charge transfer section does not exit and thus the polycrystalline silicon electrode 11a cannot be passed on the channel stop for separating each pixel of the light receiving section 1a so as to connected with the polycrystalline silicon electrode 11a of the signal charge transfer section 3a. For this reason, the pulse line L7 to which a clock pulse φ2 is applied must be arranged between the signal charge transfer section 3a and its adjoining color light receiving section 1b as in the case of the pules line L6 to which a clock pulse φ1 is applied. As a result, in the color linear image sensor of FIG. 21, since two pulse lines for driving the CCD shift register of the signal charge transfer section 3a must be provided between the light receiving sections adjacent to each other, e.g., 1a and 1b, a line-to-line distance between the light receiving sections adjacent to each other is increased more compared with that of the conventional example shown in FIG. 12. Specifically, a line-to-line distance is totally 96 μm (M=2), which is obtained by adding up the following sizes : (1) a size of one pixel of the light receiving section is 8 μm; (2) a size of the signal charge reading section is 10 μm; (3) a size of the signal charge transfer section is 18 μm; (4) a size of the element separation region between the signal charge transfer section and its adjoining light receiving section array (including sizes of the two pulse lines) is 49 μm ; (5) a size of the signal charge storage section is 8 μm; and (6) a size of a connected part between (2) and (3) is 3 μm. These sizes are obtained based on the numerical values of the factors for calculating the line-to-line distance of the conventional example of FIG. 12. This distance value is an increase of 50% compared with that of the conventional example of FIG. 12. Therefore, with the present example, residual images can be reduced, but it is not suited as a color linear image sensor.

SUMMERY OF THE INVENTION

According to an aspect of the present invention, provided is a color linear image sensor having a small line-to-line distance, which comprises on a semiconductor substrate: a plurality of light receiving section array; signal charge storage sections respectively adjacent to the light receiving sections; signal charge reading sections respectively adjacent to the signal charge storage sections; and signal charge transfer section for transferring signal chargers read by the signal charge reading sections from the signal charge storage sections to signal charge conversion sections. In this case, each of the signal charge reading sections includes an N-type (or P-type) region selectively formed in a surface of a P-type (or N-type) semiconductor well, a first P-type (or N-type) region selectively formed in a surface of the N-type (or P-type) region and an electrode formed on the first P-type (or N-type) region interposing a gate insulating film. The electrode of the signal charge reading section is electrically connected with an electrode for constituting a portion of the signal charge transfer section which is adjacent to the signal charge reading section. Driving pulses for both electrodes are made common (φ1 (TG)) Not a DC voltage but a pulse is applied to an electrode for constituting the signal charge storage section.

According to another aspect of the present invention, provided is a color linear image sensor having a small line-to-line distance, which comprises on a semiconductor substrate: a plurality of light receiving section array; signal charge storage sections respectively adjacent to the light receiving sections; signal charge reading sections respectively adjacent to the signal charge storage sections; and signal charge transfer sections for transferring signal charges read by the signal charge reading sections from the signal charge storage sections to signal charge conversion sections. In this case, each of the signal charge reading sections includes an N-type (or P-type) region selectively formed in a surface of a P-type (or N-type) semiconductor well, a first P-type (or N-type) region selectively formed in a surface of the N-type (or P-type) region and an electrode formed on the first P-type (or N-type) region interposing a gate insulating film. An electrode for constituting the signal charge storage section is electrically connected with an electrode for constituting a portion of the signal charge transfer section which is not adjacent to the signal charge reading section. Not DC voltages but common driving pulses φ2 (ST) are applied to both electrodes.

With the color linear image sensors constructed in both of the foregoing manners, residual images can be reduced without greatly increasing a line-to-line distance between the light receiving section array adjacent to each other.

BRIEF DESCRIPTION OF THE DRAWINGS

These and other objects, features and advantages of the present invention will become more apparent upon a reading of the following detailed description and drawings, in which:

FIG. 5 is a timing chart of the first embodiment shown in FIGS. 1 to 4;

FIG. 5 is channel potential views of respective portions of the sectional views of FIGS. 3 and 4 at time (t1 to t7);

FIG. 10 are a timing chart of the second embodiment shown in FIGS. 6 to 9, and channel potential views of respective portions of the sectional views of FIGS. 8 and 9 at time (t1 to t5);

DETAILED DESCRIPTIONS OF PREFERRED EMBODIMENTS

Next, the preferred embodiments of the present invention will be described with reference to the accompanying drawings.

Figure 1:
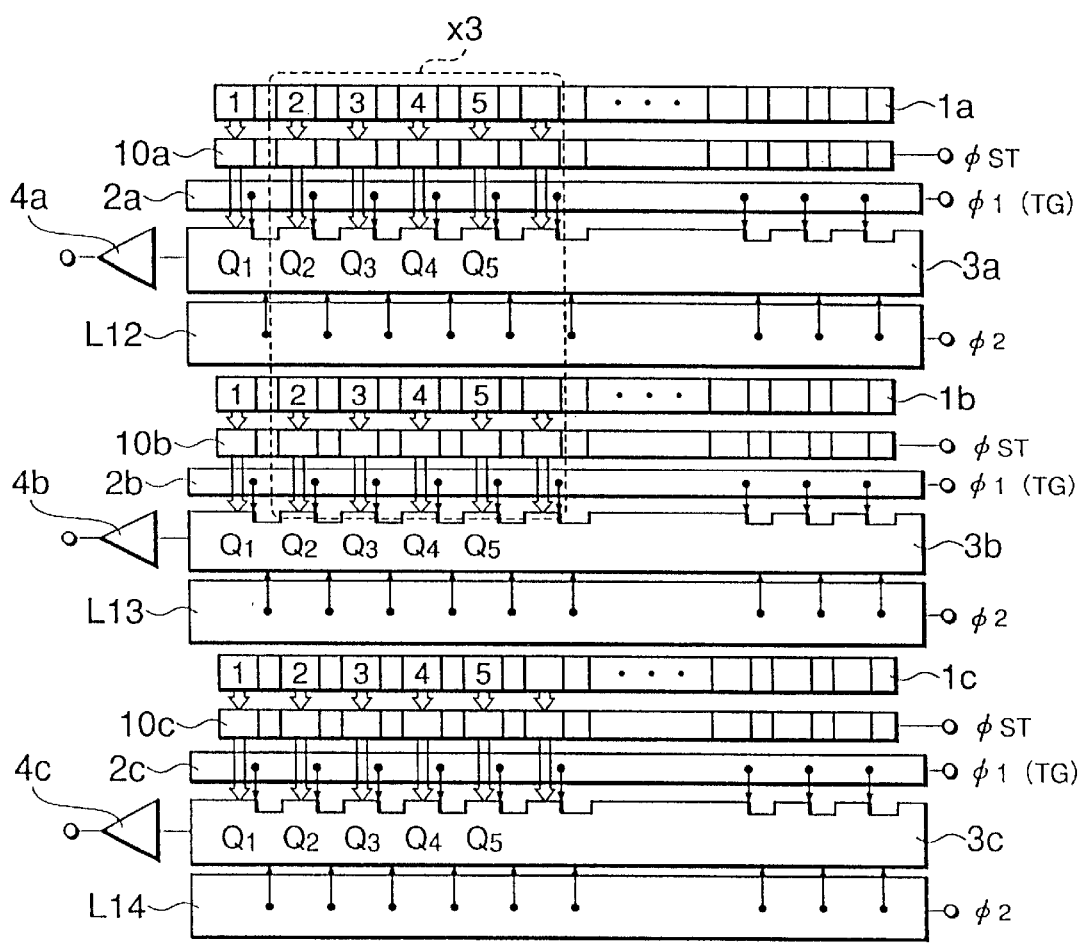
FIG. 1 is an entire constitutional view of a color linear image sensor according to a first embodiment of the present invention.
Figure 11:
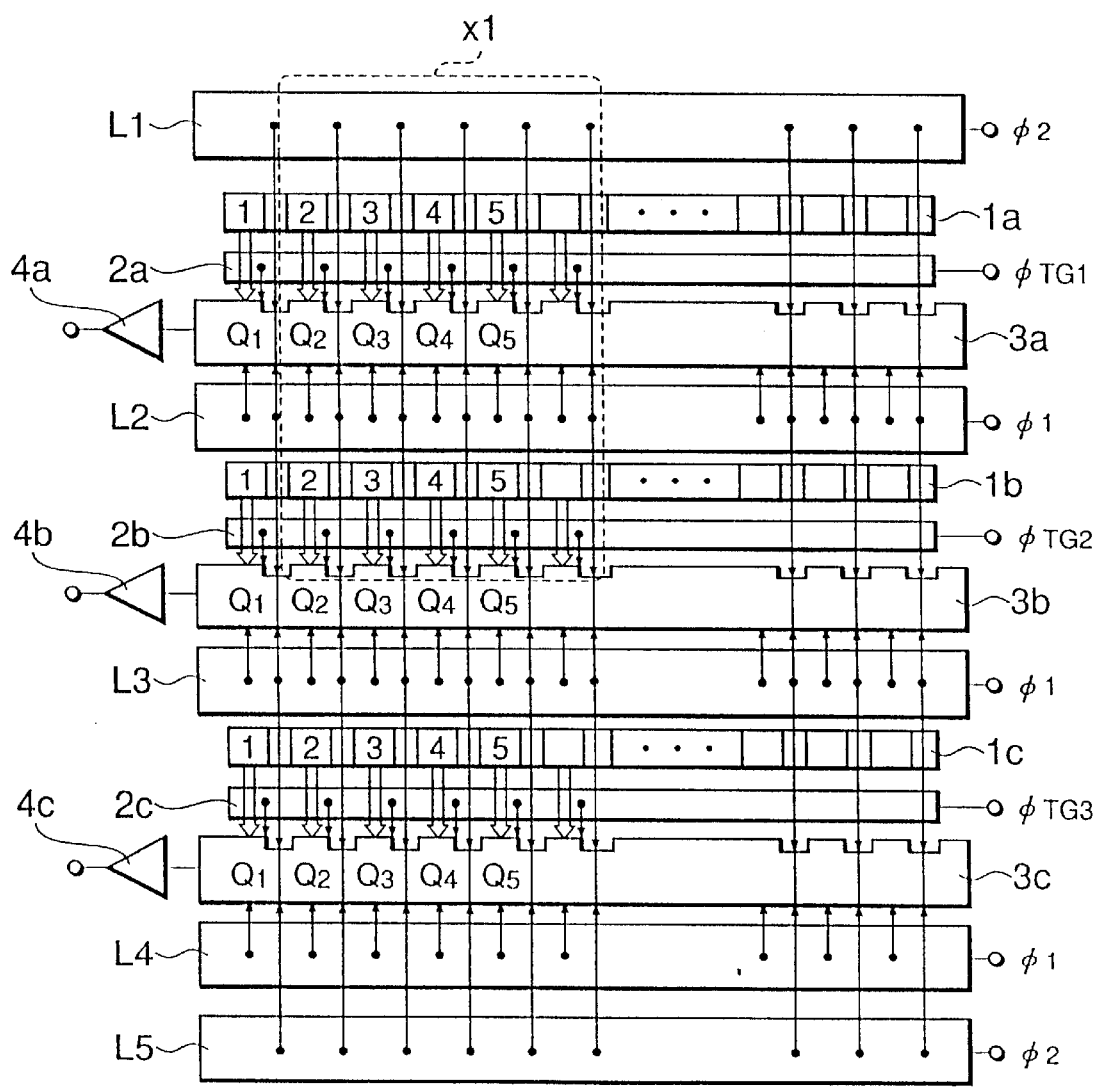
FIG. 11 is an entire constitutional view of a conventional color linear image sensor.

Referring first to FIG. 1 which is an entire constitutional view showing a color linear image sensor according to a first embodiment of the present invention. In the drawing, the same reference numerals as those used in FIG. 11 denote the same elements.

According to the first embodiment, signal charge storage sections 10a, 10b and 10c are respectively provided between light receiving sections 1a, 1b and 1c of respective colors and signal charge reading sections 2a, 2b and 2c. Clock pulses φST are applied to the signal charge storage sections 10a, 10b and 10c. Electrodes for constituting the signal charge reading sections 2a, 2b and 2c are electrically connected with electrodes for constituting portions of signal charge transfer sections 3a, 3b and 3c which are adjacent to the signal charge reading sections. Pulses φ1 (TG) are applied to the signal charge reading sections 2a, 2b and 2c (pulse lines are not shown). Reference numerals L12, L13 and L14 denote pulse lines to which pulses φ2 selected from two-phase pulses applied to the signal charge transfer sections 3a, 3b and 3c and different from φ1 (TG) are applied.

Figure 2:
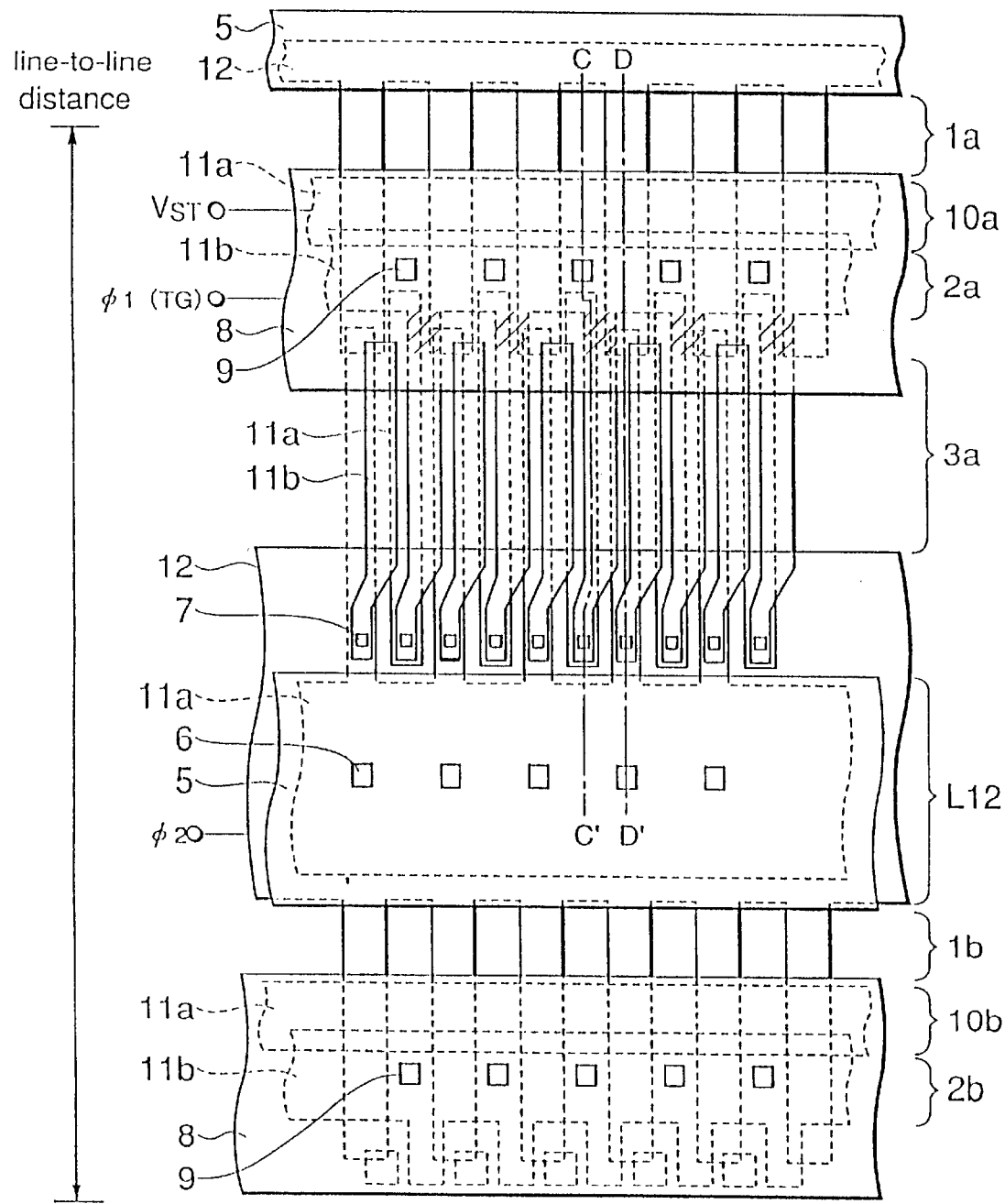
FIG. 2 is an expanded view of a region surrounded with a broken line X3 of FIG. 1.

Referring to FIG. 2, shown is an expanded region surrounded with a broken line X3 of FIG. 1. In the drawing, the same reference numerals as those used in FIGS. 1 and 12 denote the same elements. As shown in FIG. 2, according to the first embodiment, an electrode for constituting the signal charge storage section 10a is composed of an electrode identical to a polycrystalline silicon electrode 11a selected from two kinds of polycrystalline silicon electrodes 11a an 11b which constitute the signal charge transfer section 3a. A clock pulse φST is applied to the signal charge storage section 10a. An electrode for constituting the signal charge reading section 2a adjacent to the signal charge storage section 10a is composed of a polycrystalline silicon electrode 11b. This polycrystalline silicon electrode 11b is directly connected with a part of the polycrystalline silicon electrode 11b which constitutes the signal charge transfer section 3a (part indicated by an oblique line). Further, the polycrystalline silicon electrode 11b for constituting the signal charge reading section 2a is electrically connected, by a contact 7, with the polycrystalline silicon electrode 11a of its adjoining signal charge transfer section 3a. A clock pulse φ1 (TG) is applied to the signal charge reading section 2a. Here, for an aluminum wiring line 8 to which the clock pulse φ1 (TG) is applied, unlike the conventional example shown in FIG. 12, in order to drive not only the signal charge reading section 2a but also the signal charge transfer section 3a having a capacity of 200 to 500 PF, wiring resistance should be reduced beforehand by setting its wiring width equal to that of an aluminum wiring line 5 for applying a clock pulse φ2 to the signal charge transfer section 3a, e.g., 15 to 20 μm.

Figure 12:
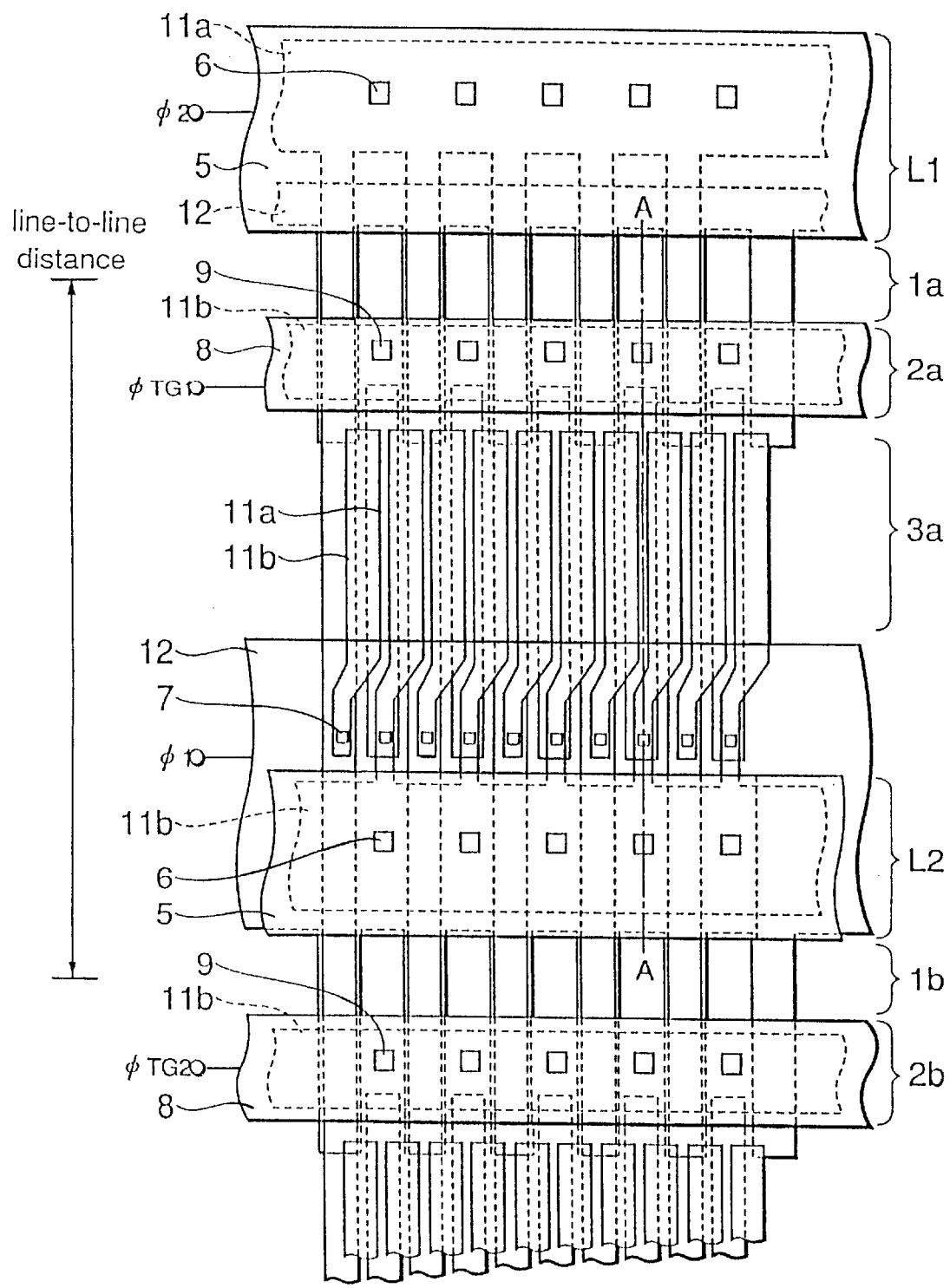
FIG. 12 is an expanded view of a region surrounded with a broken line X1 of FIG. 11.
Figure 21:
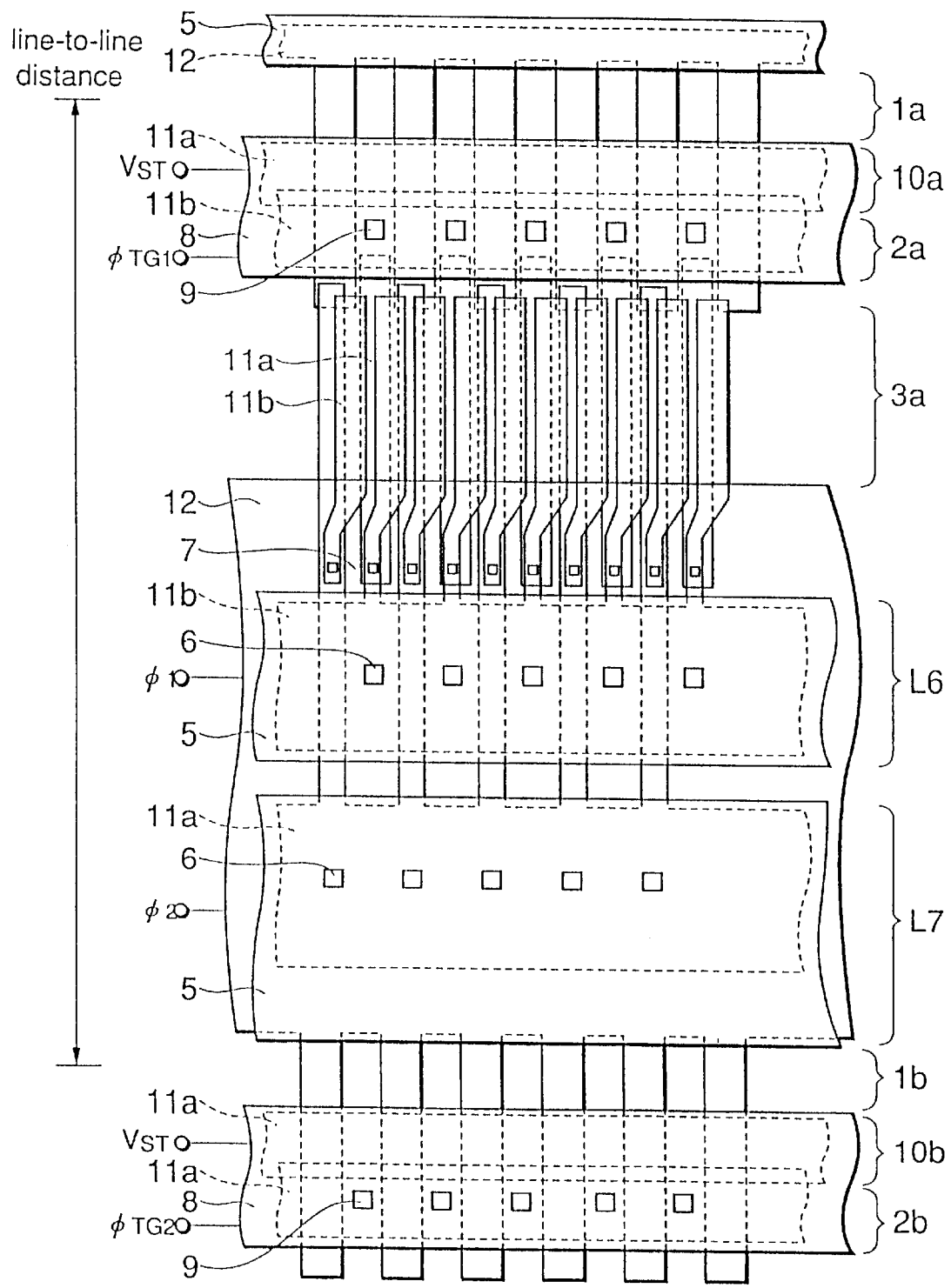
FIG. 21 is an expanded view of a region surrounded with a broken line X2 of FIG. 20.

If a line-to-line distance between the light receiving sections adjacent to each other in the first embodiment is calculated based on numerical values of the respective factors used for calculating the line-to-line distances of the conventional examples shown in FIGS. 12 and 21, it is totally 72 μm (M=9). This total line-to-line distance 72 μm is specifically obtained by adding up the following sizes: (1) one pixel size of the light receiving section is 3 μm; (2) a size of the signal charge reading section is 10 μm; (3) a size of the signal charge transfer section is 18 μm; (4) a size of the element separation region between the signal charge transfer section and its adjoining light receiving section array (including a size of one pulse line) is 25 μm; (5) a size of the signal charge storage section is 8 μm; and (6) a size of a connected region between (2) and (3) is 3 μm. The line-to-line distance 72 μm is a value lower by 33.3% than that of the conventional example having the signal charge storage section shown in FIG. 21. Compared with that of the conventional example having no signal charge storage sections shown in FIG. 12, it is larger only by 12.5%. It should be noted that the pulse line (aluminum winding wire 8) of a pulse φ1 (TG) applied to the signal charge reading section and the signal charge transfer section is included in the line-to-line distance as it is positioned on the signal charge storage section, the signal charge reading section, the signal charge transfer section and the upper parts of the respective connected regions thereof in the arrangement of the constituting elements.

Figure 3:
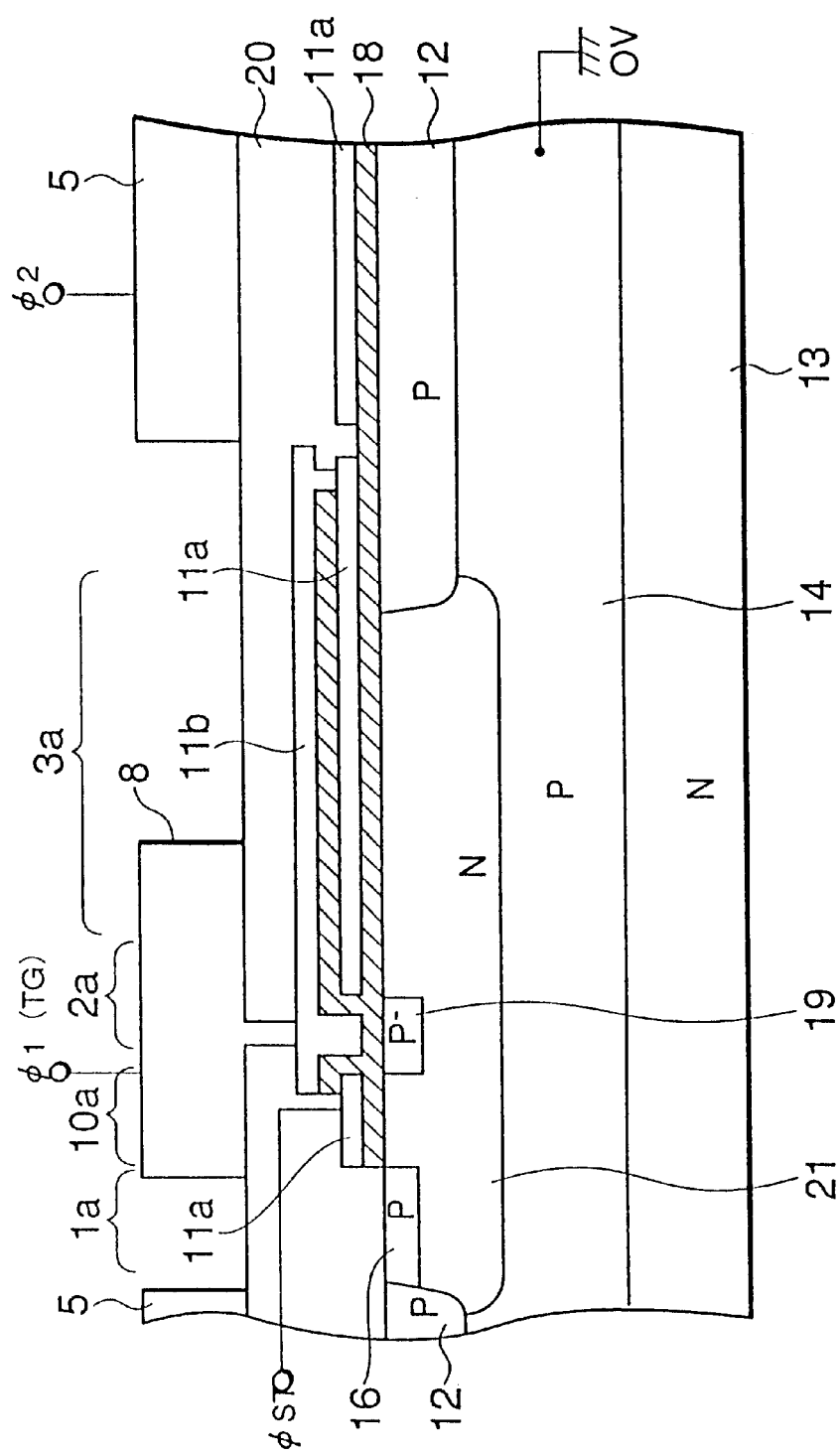
FIG. 3 is a sectional view respectively taken along lines C—C.
Figure 4:
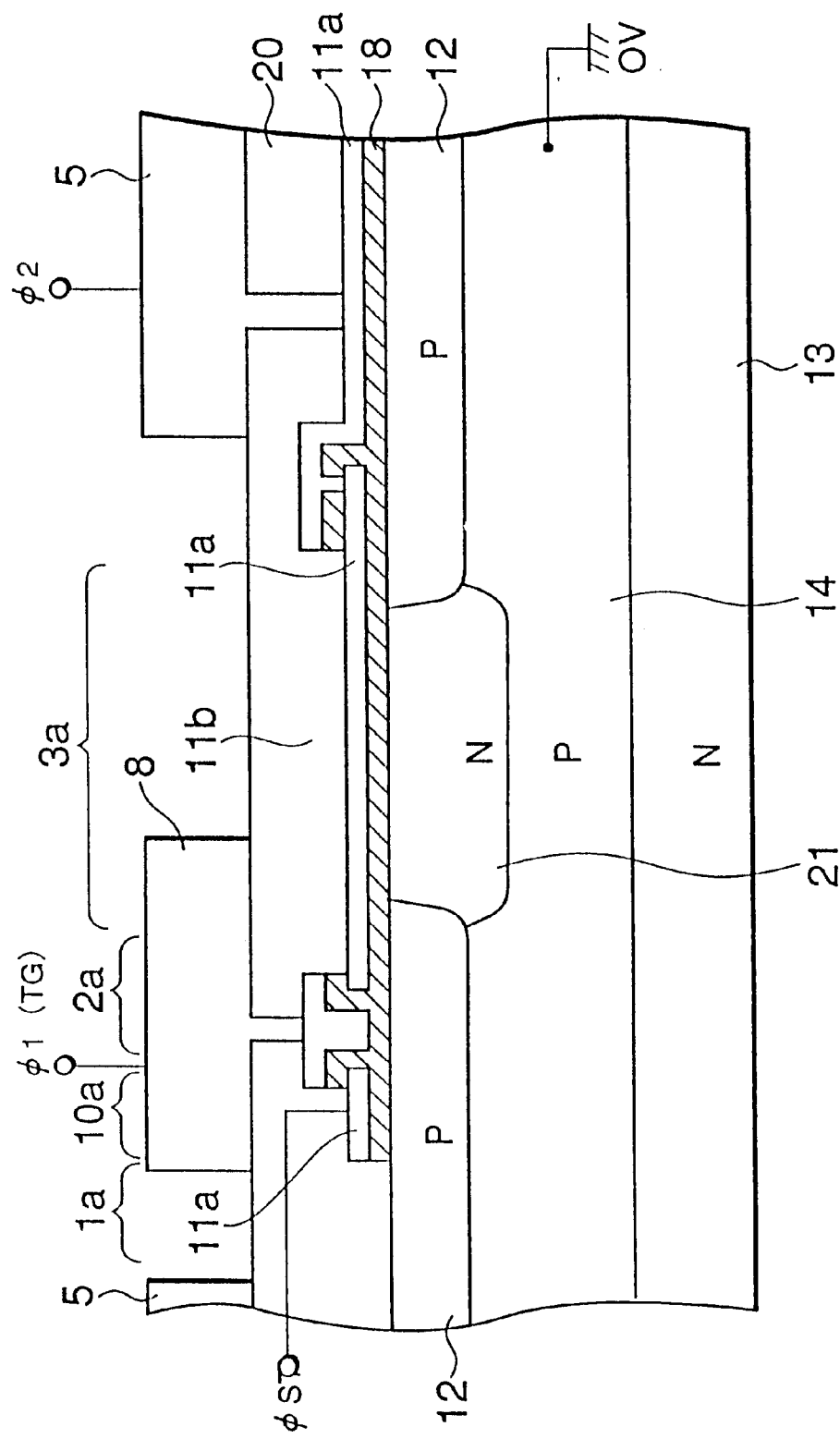
FIG. 4 is a sectional views respectively taken along lines D—D of FIG. 2.
Figure 13:
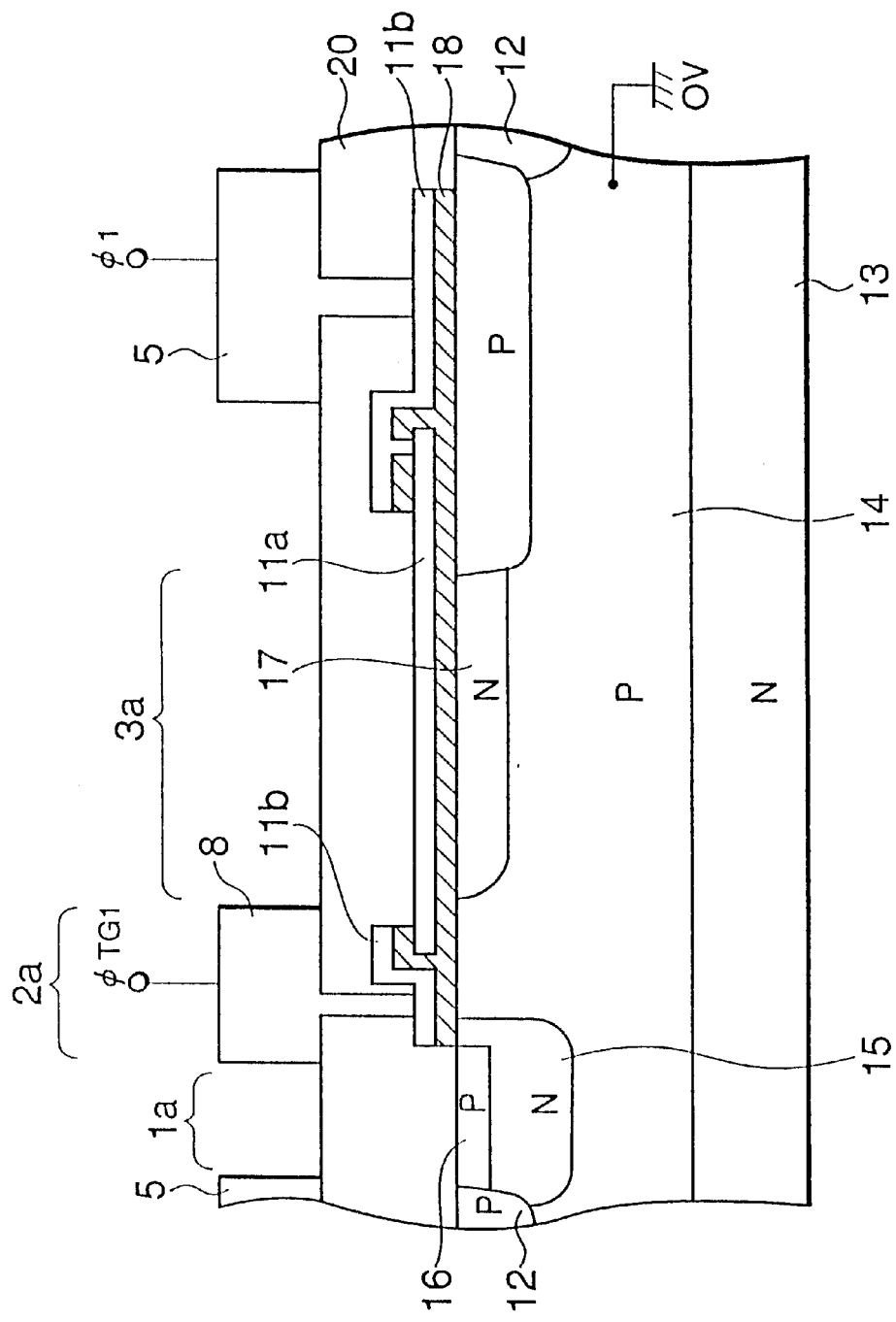
FIG. 13 is a sectional view taken along a line A—A of the conventional color linear image sensor shown in FIG. 12.
Figure 14:
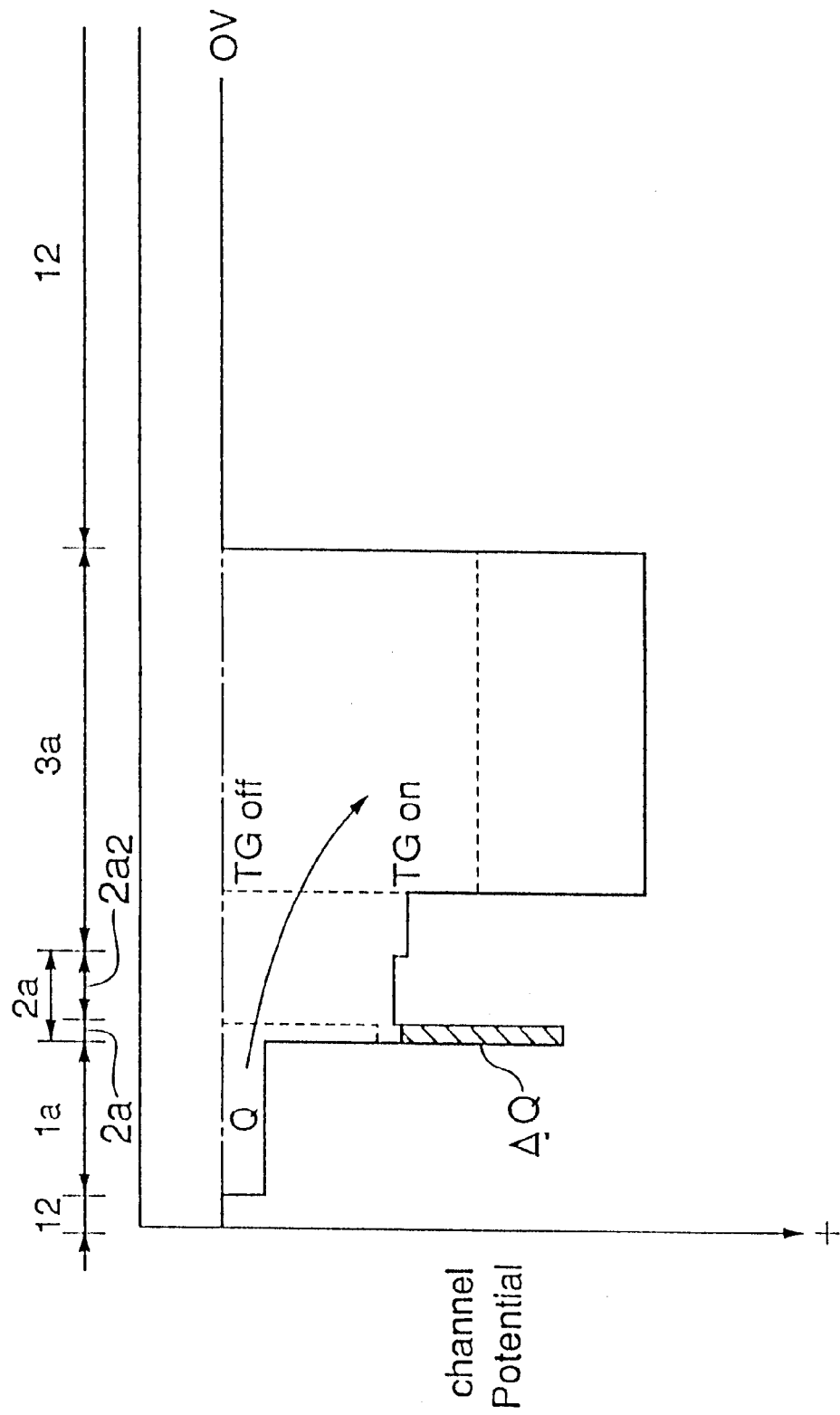
FIG. 14 is a channel potential view of a light receiving section 1a, a signal charge reading section 2a or a signal charge transfer section 3a of FIG. 13.
Figure 15:
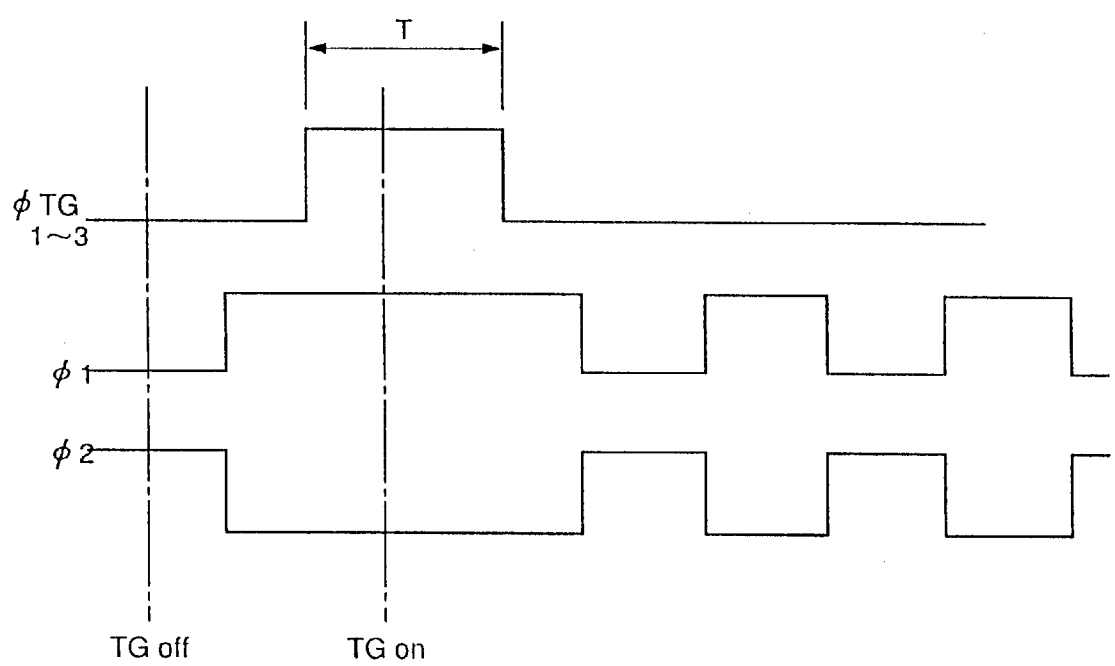
FIG. 15 is a timing chart for showing a driving method of the conventional color linear image sensor shown in FIG. 11.
Figure 16:
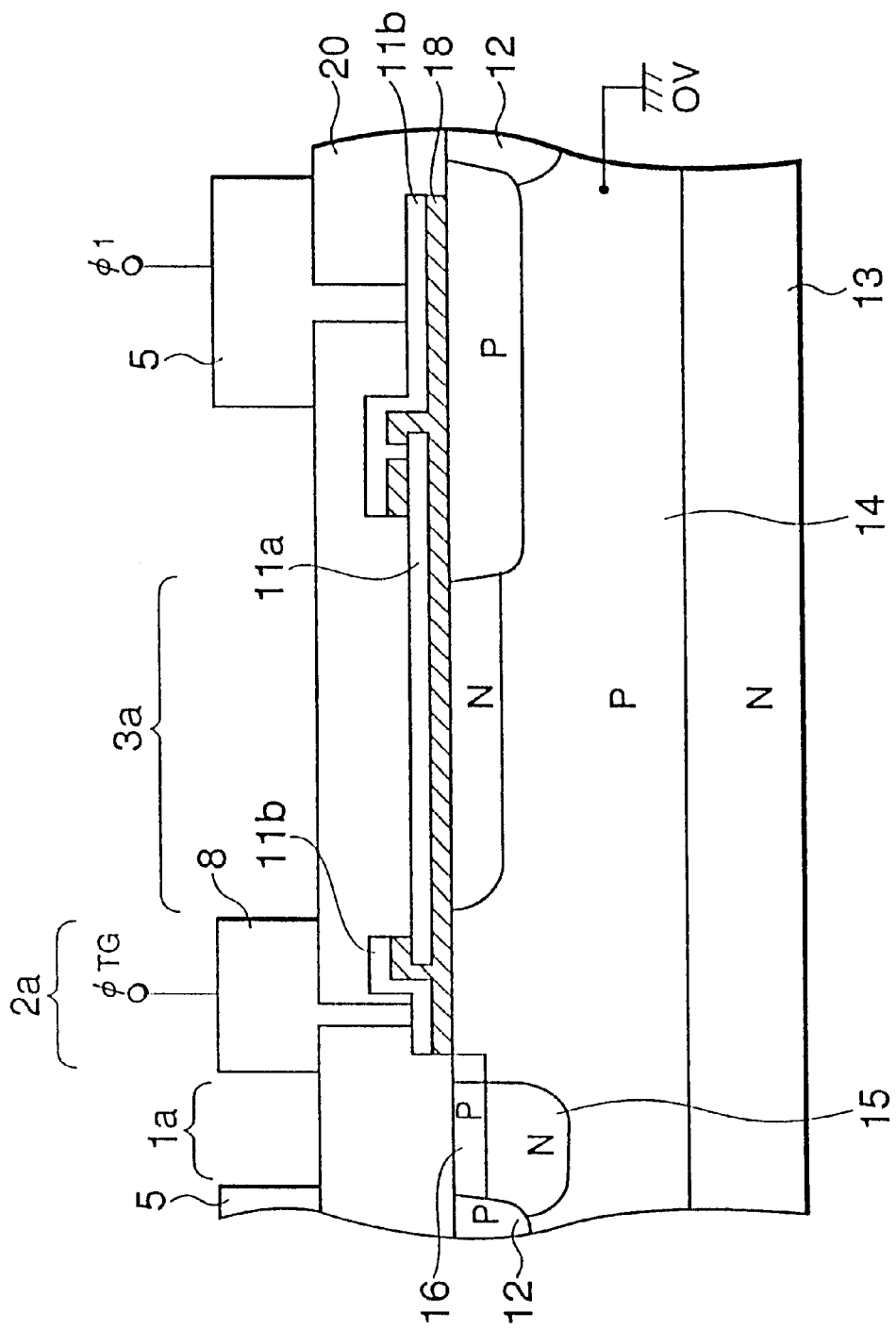
FIG. 16 is a sectional view of a conventional color linear image sensor without N-type region as shown in FIG. 13.
Figure 17:
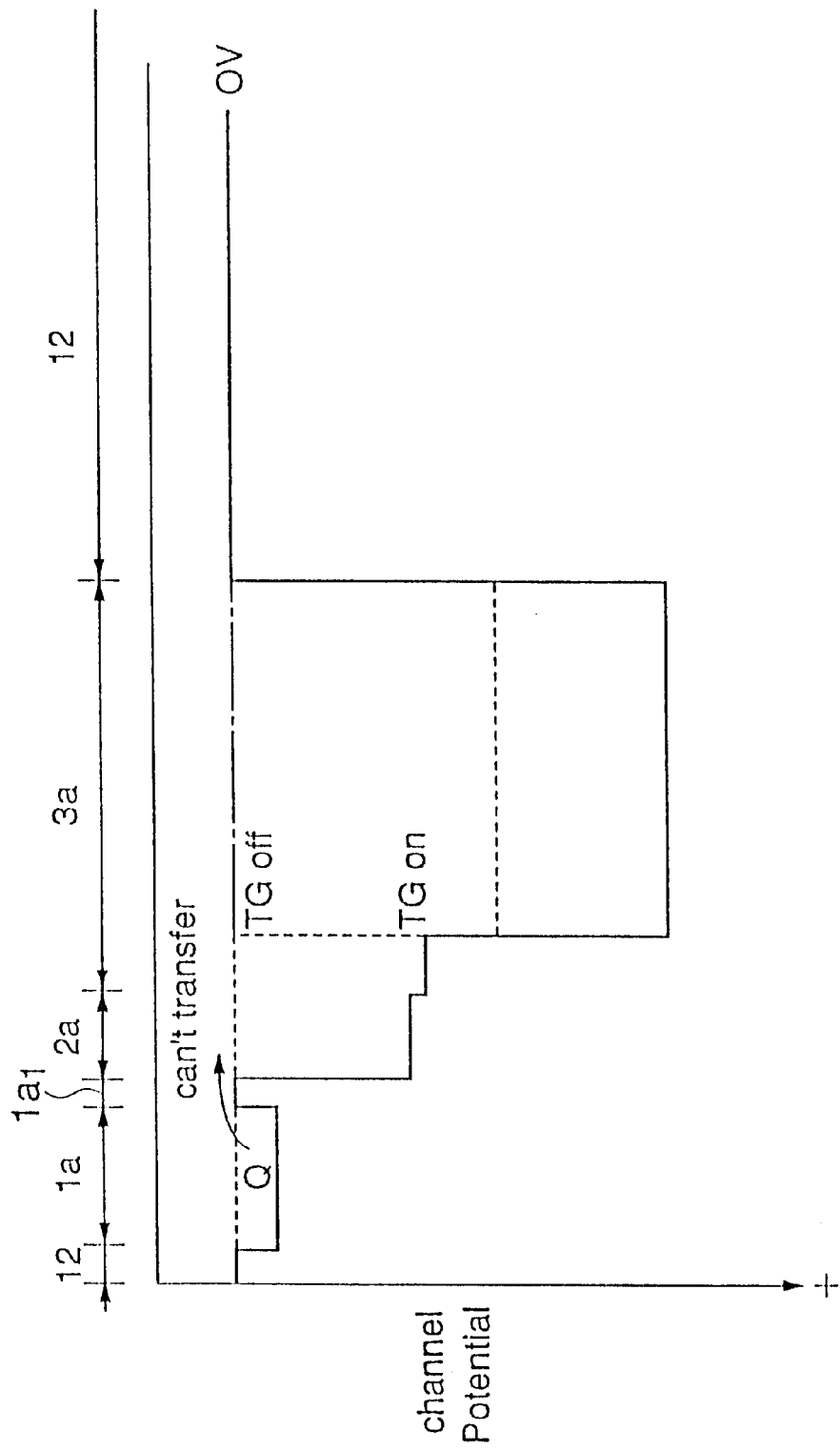
FIG. 17 is a channel potential view as shown in FIG. 16.
Figure 18:
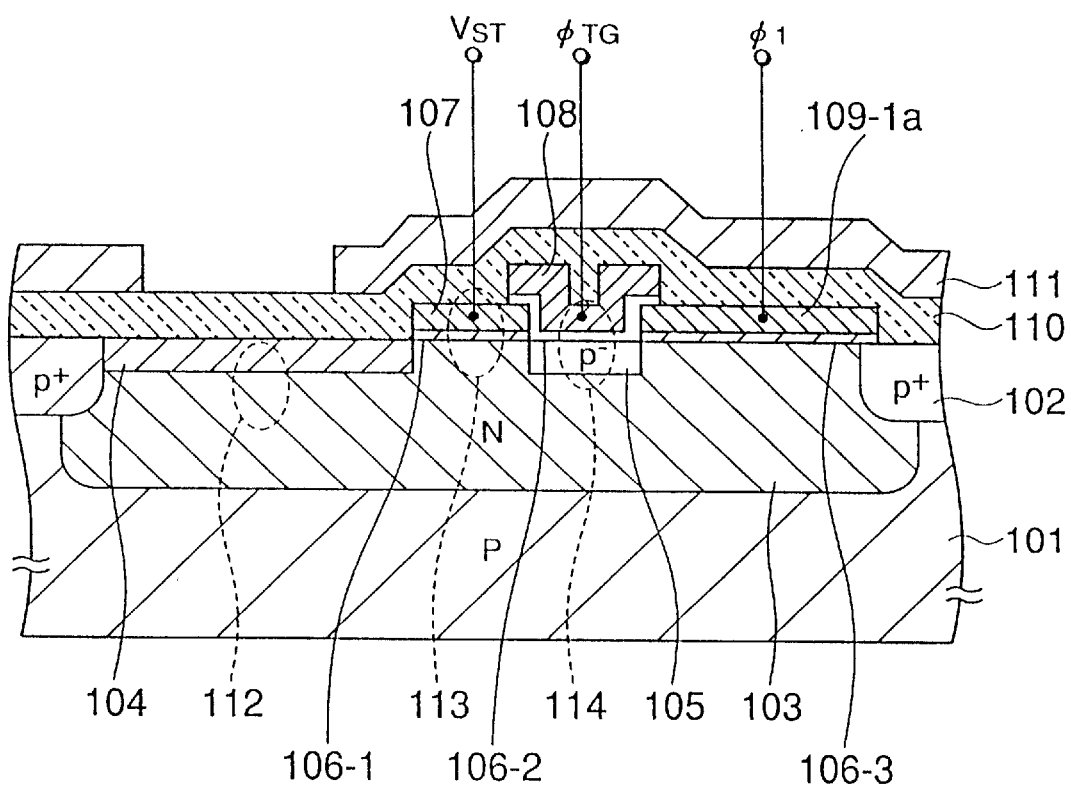
FIGS. 18 is a view respectively showing FIG. 6 of Patent Publication Hei 8 (1996)-10760.
Figure 19:
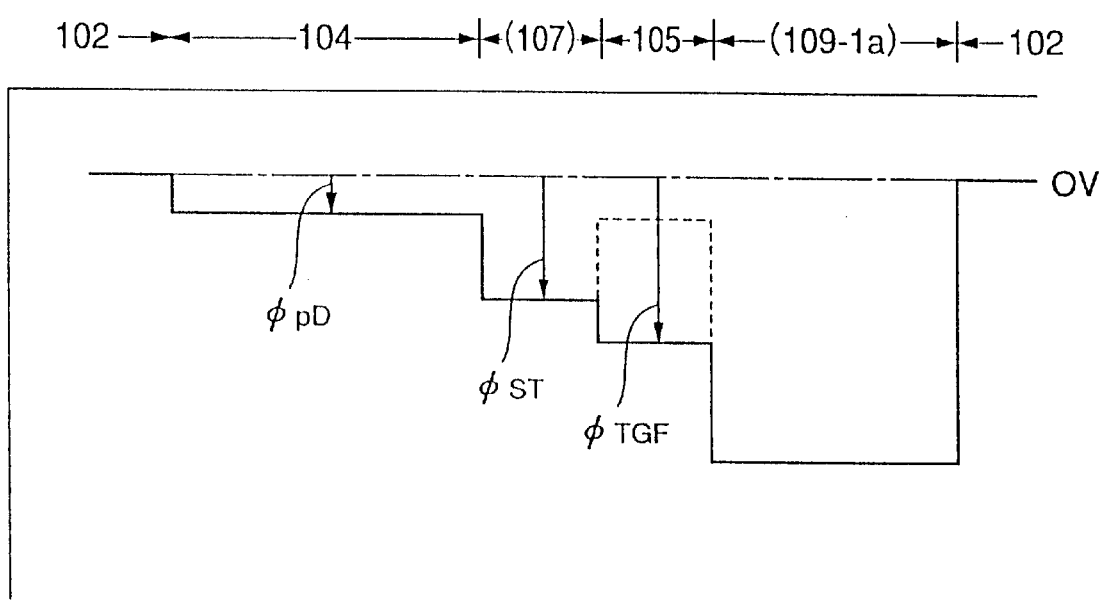
FIG. 19 is a view respectively showing Fig7. 6 of Patent Publication Hei 8 (1996)-10760.
Figure 20:
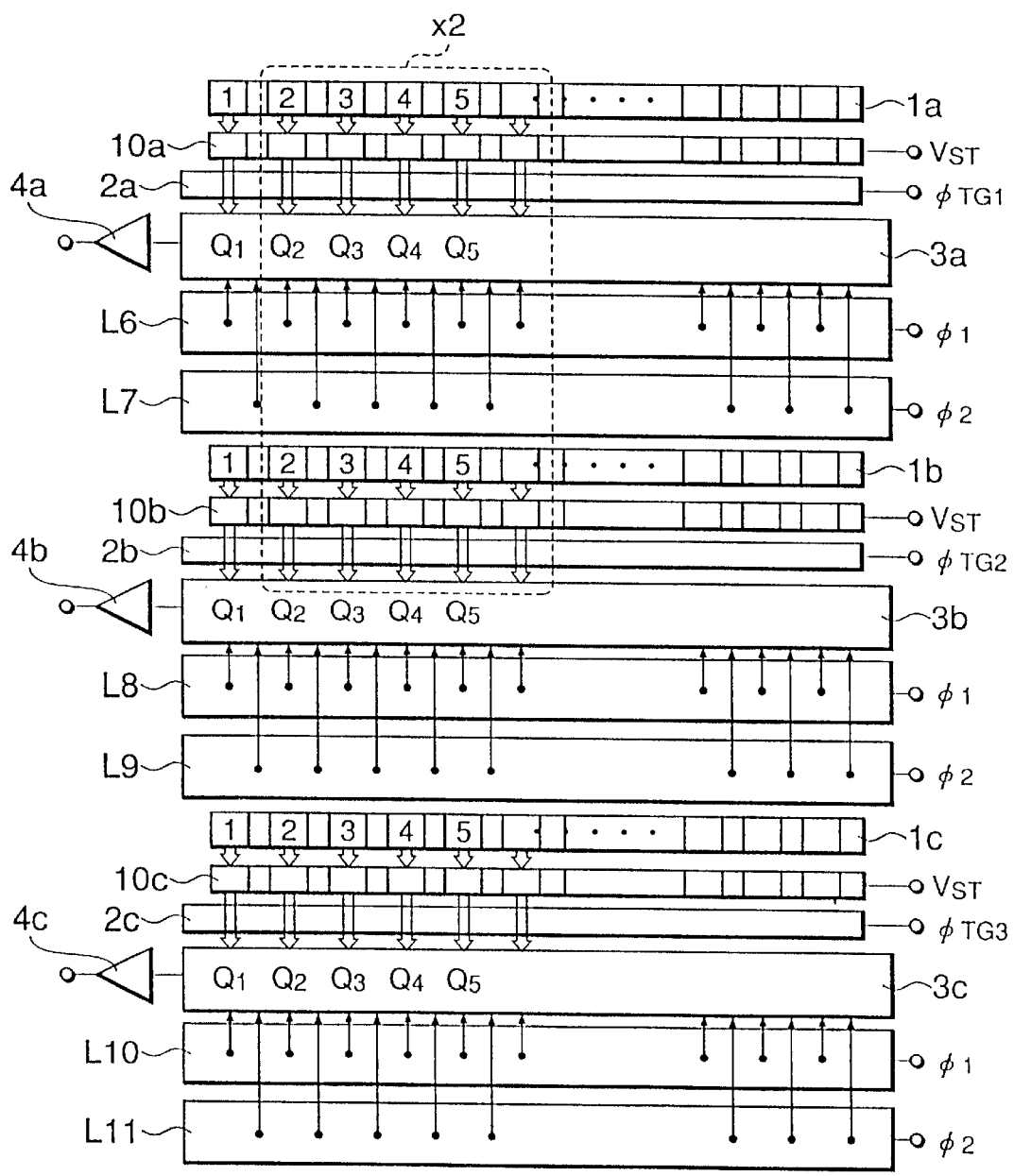
FIG. 20 is an entire constitutional view of an example of constructing a color linear image sensor by using a linear image sensor disclosed in Patent Publication Hei 8 (1996)-10760.

Next, a manufacturing method of the first embodiment will be described by referring to FIGS. 3 and 4. In FIGS. 3 and 4 which are sectional views respectively taken along lines C—C' and D-D' of FIG. 2, the same reference numerals as those used in FIGS. 2 and 13 denote the same elements. In the drawings, a reference numeral 13 denotes an N-type semiconductor substrate. On the N-type semiconductor substrate 13, a P well 14 is first formed by ion-implanting P-type impurities such as boron having concentration of 1012 to 1013/cm2 and carrying out thermal diffusion at a high temperature of about 1200° C. for approximately ten hours. Subsequently, an N-type region 21 is formed by ion-implanting N-type impurities such as phosphorus or boron having concentration of about 1012/cm2, by energy of about 100 KeV, to specified places for forming the light receiving section 1a, the signal charge storage section 10a, the signal charge reading section 2a and the signal charge transfer section 3a and carrying out thermal diffusion at a high temperature of about 1000° C. for approximately three hours. Then, an element separation region 12 is formed in a specified place by ion-implanting P-type impurities having concentration of about 1012/cm2 by energy of about 50 KeV. For the element separation region 12 and the P well 14, reference potentials (OV) are taken in from the outside. Reference numerals 11a and 11b denote polycrystalline silicon electrodes having thickness of 400 to 500 nm, which are pattern-formed on a wafer by using a thermal oxidized film 18 of about 100 nm as an insulating film after formation of the foregoing element separation region 12. A reference numeral 16 denotes a P-type region for constituting the light receiving section 1a. This P-type region 16 is formed by ion-implanting, after formation of the polycrystalline silicon electrode 11a, P-type impurities such as boron having concentration of about 1012/cm2 to the surface of the N-type region 21 by using the polycrystalline silicon electrode 11a as a mask and energy of about 40 KeV and in self-alignment with the polycrystalline silicon electrode 11a. An incident light is subjected to photoelectric conversion by a PN junction which is composed of the P-type region 16, the N-type region 21 and P well 14 and operates as a light receiving section. The P well 14, the N-type region 21, the thermal oxidized film 18 and the polycrystalline silicon electrode 11a constitute a buried channel type transistor, the signal charge storage section 10a and the signal charge transfer section 3a. A clock pulse φST is applied to the polycrystalline silicon electrode 11a for constituting the signal charge storage section 10a by a specified timing. A reference numeral 19 denotes a P-type region for constituting the signal charge reading section 2a. This P-type region 19 is formed by ion-implanting P-type impurities such as boron having concentration of about 1011/cm2 to the surface of the N-type region 21 by using the polycrystalline silicon electrodes 11a respectively constituting the signal charge storage section 10a and the signal charge transfer section 3a as masks and energy of about 30 KeV and in self-alignment with the respective polycrystalline silicon electrodes 11a. According to the first embodiment constructed by the foregoing manufacturing method, the P-type region 19 for constituting the signal charge reading section 2a is formed in self-alignment with the polycrystalline silicon electrodes 11a of the signal charge storage section 10a and the signal charge transfer section 3a adjacent to each other. Accordingly, a channel potential below the polycrystalline silicon electrode 11b of the signal charge reading section 2a is kept uniform, and no portions (2a1, 2a2) like those shown in FIG. 14 where channel potentials are different from each other exist. Therefore, when signal charges are read from the signal charge storage section 10 through the signal charge reading section 2a to the signal charge transfer section 3a, no signal charges are left untransferable and thus no residual images are generated. This situation and an operation of the first embodiment will be described below.

Referring to FIG. 5, shown are a timing chart of the first embodiment shown in FIGS. 1 to 4 and channel potentials of respective portions of the sectional views of FIGS. 3 and 4 at time (t1 to t7). Lights made incident on the light receiving section 1a in a period until the time t1 are subjected to photoelectric conversion and then stored in the signal charge storage section 10a. At the time t2 (signal charges Qi), a pulse φ1 (TG) applied to the respective polycrystalline silicon electrodes 11b of the signal charge reading section 2a and the signal charge transfer section 3a connected to the same is changed from a LOW level to a HIGH level, and the stored signal charges Qi are transferred through the signal charge reading section 2a to the signal charge transfer section 3a. Here, below the polycrystalline silicon electrode 11b of the signal charge reading section 2a, the P-type region 19 is formed in the surface of the N-type region 21 in self-alignment with the polycrystalline silicon electrodes 11a of the signal charge storage section 10a and the signal charge transfer section 3a adjacent to each other. Accordingly, its channel potential is uniform. Therefore, at the time t2, no places exist where signal charges are left untransferable during transfer of the signal charges Qi from the signal charge storage section 10a to the signal charge transfer section 3a.

At the time t3 and thereafter, signal charges qi of a next line from the line subjected to photoelectric conversion in the light receiving section 1a are gradually stored in the signal charge storage section 10a (signal charge amount is proportional to storing time). In the signal charge transfer section 3a, the signal charges Qi are transferred by pulses φ1 (TG) and φ2 which have phases reverse to each other. In the transfer period of the signal charges (t3 to t7 and thereafter), a pulse φST applied to the signal charge storage section 10a should be set equal to a potential of a pulse φ1 (TG) or higher. This is for preventing mixing between the signal charges Qi to be transferred and the signal charges qi of the next line to be stored by utilizing the fact that because the signal charge reading section 2a has the P-type region 19 provided in the surface of the N-type region 12 as described above, if applied voltages are equal, its channel potential is always lower (potential difference is VB) than that of the adjoining signal charge storage section 10a by an amount equivalent to the existence of the P-type region 19. In other words, according to the first embodiment, a maximum amount of charges stored in the signal charge storage section 10a is determined by this potential difference VB.

Figure 6:
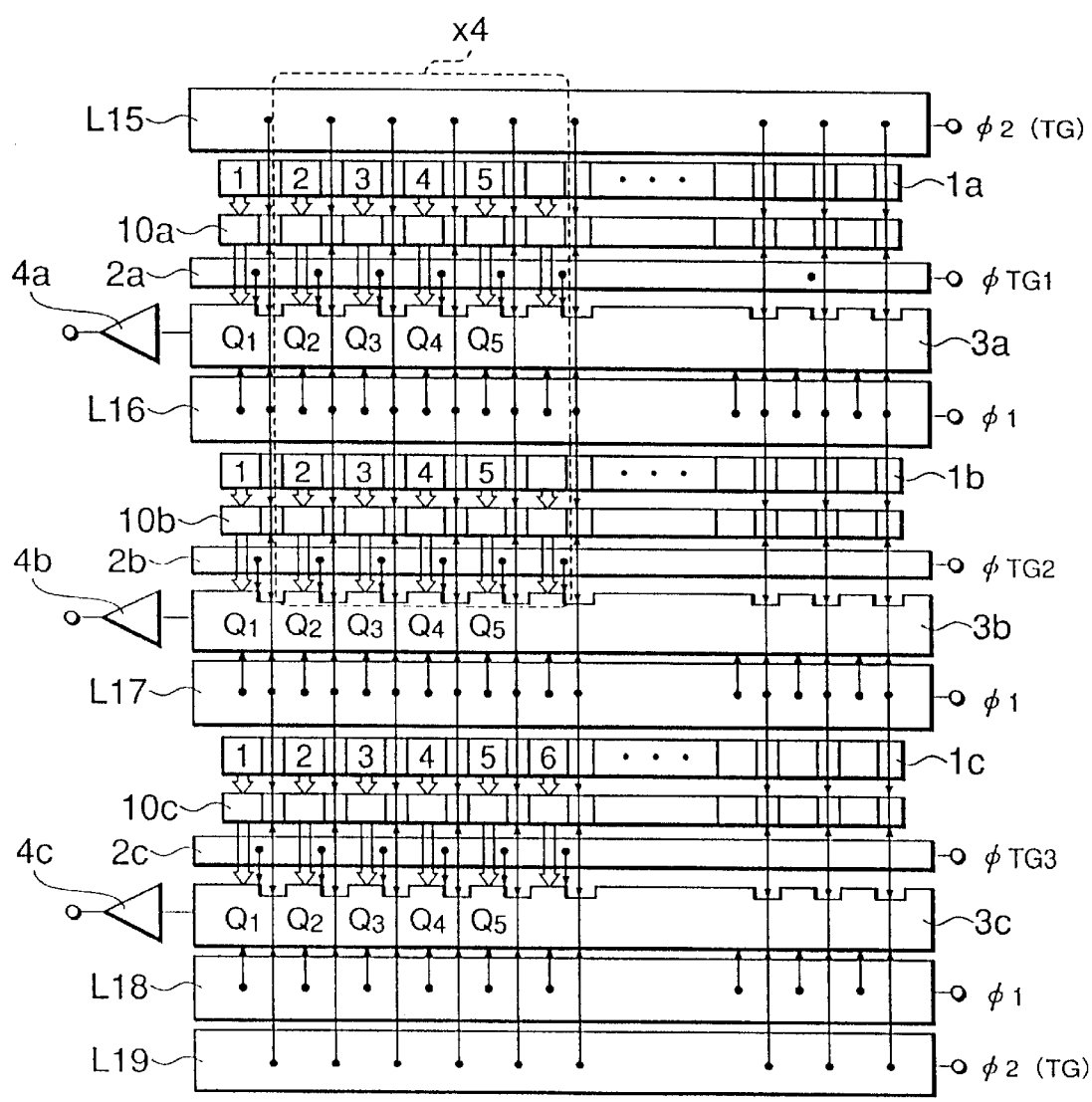
FIG. 6 is an entire constitutional view of a color linear image sensor according to a second embodiment of the present invention.

Next, a second embodiment of the present invention will be described. Referring now to FIG. 6 which is an entire constitutional view, shown is a second embodiment of a color linear image sensor of the present invention. In the drawing, the same reference numerals as those used in FIG. 1 denote the same elements. In the second embodiment, signal charge storage sections 10a, 10b and 10c are respectively provided between light receiving sections 1a, 1b and 1c of respective colors and signal charge reading sections 2a, 2b and 2c. These signal charge storage sections 10a, 10b and 10c are electrically connected with electrodes for constituting portions of signal charge transfer sections 3a, 3b and 3c which are not adjacent to the respective signal charge reading sections. Pulses φ2 (ST) are applied to the signal charge storage sections 10a, 10b and 10c. Reference numerals L15 and L19 denote pulse lines for applying pulses φ2 (ST). Reference numerals L16, L17 and L18 denote pulse lines to which pulses φ1 selected from two phase pulses applied to the signal charge transfer sections 3a, 3b and 3c and different from φ2 (ST) are applied.

Figure 7:
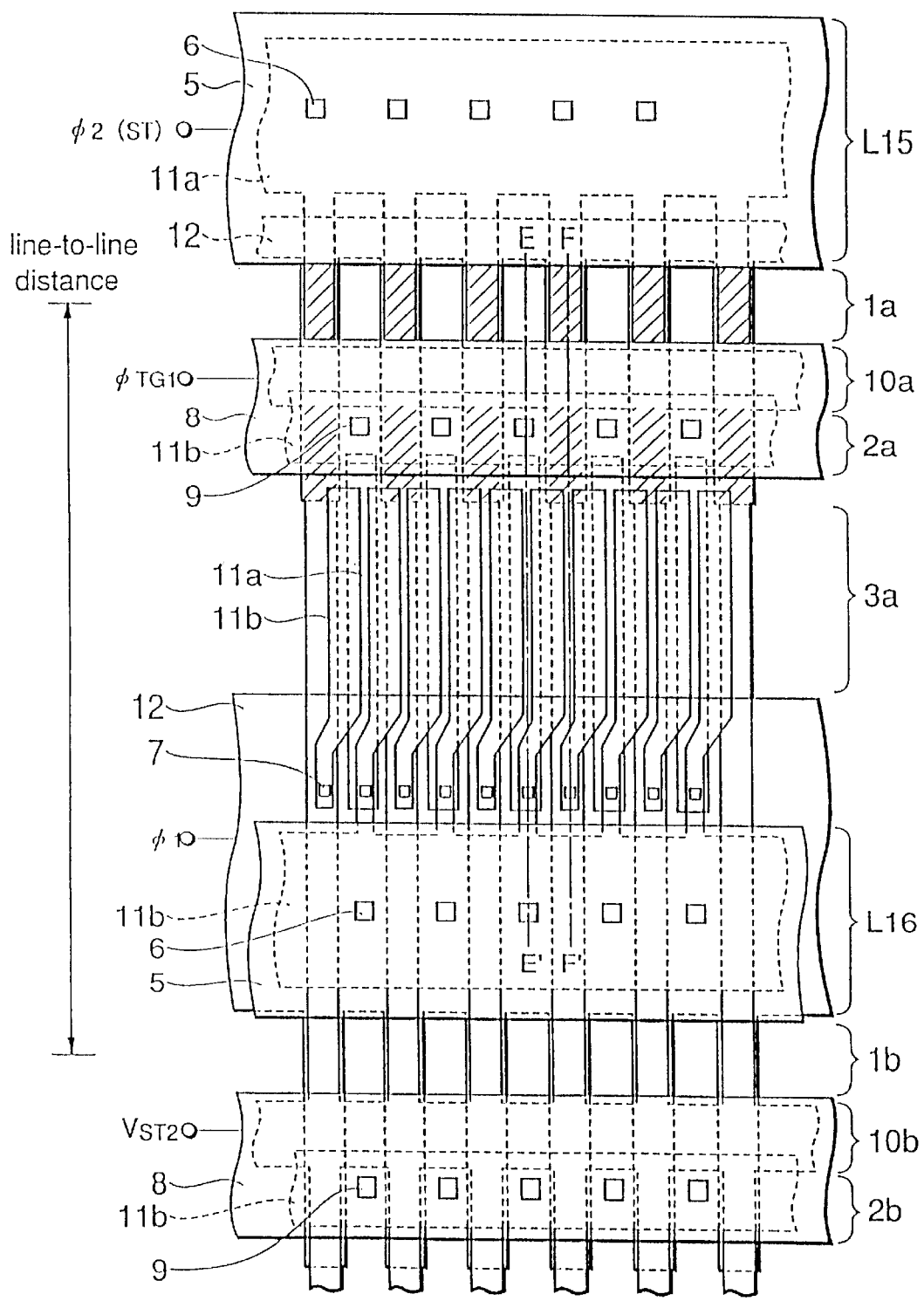
FIG. 7 is an expanded view of a region surrounded with a broken line X4 of FIG. 6.

Referring to FIG. 7, shown is an expanded region surrounded with a broken line X4 of FIG. 6. In the drawing, the same reference numerals as those used in FIGS. 6 and 2 denote the same elements. As shown in FIG. 7, in the second embodiment, an electrode for constituting the signal charge storage section 10a is identical to a polycrystalline silicon electrode 11a selected from two kinds of polycrystalline silicon electrodes 11a and 11b for constituting the signal charge transfer section 3a. On an element separation region 12, this electrode is directly connected with the polycrystalline silicon electrode 11a for constituting a portion of the signal charge transfer section 3a which is not adjacent to the signal charge reading section 2a and a polycrystalline silicon electrode 11a for constituting the pulse line L15 (part indicated by an oblique line). A clock pulse φ2 (ST) is applied to this electrode. An electrode for constituting the signal charge reading section 2a adjacent to the signal charge storage section 10a is identical to the polycrystalline silicon electrode 11b. A signal charge reading pulse φTG is applied to this electrode as in the case of the conventional example.

In the second embodiment, a line-to-line distance between the light receiving sections adjacent to each other is totally 72 μm (M=9), which is calculated by adding up the following sizes as in the case of the first embodiment shown in FIG. 2: (1) one pixel size of the light receiving section is 8 μm; (2) a size of the signal charge reading section is 10 μm; (3) a size of the signal charge transfer section is 18 μm; (4) a size of the element separation region between the signal charge transfer section and its adjoining light receiving section array (including a size of one pulse line) is 25 μm; (5) a size of the signal charge storage section is 8 μm; and (6) a size of a connected region between (2) and (3) is 3 μm. Apparently, a line-to-line distance equal to that in the case of the first embodiment can be obtained.

Next, a manufacturing method of the second embodiment will be described by referring to FIGS. 8 and 9 which are sectional views respectively taken along lines E–E' and F–F' of FIG. 7, the same reference numerals as those used in FIG. 7 and FIGS. 3 and 4 denote the same elements, and a manufacturing method thereof is the same as that described above with reference to the first embodiment.

According to the second embodiment made by the foregoing manufacturing method, as in the case of the first embodiment, a P-type region 19 for constituting the signal charge reading section 2a is formed in self-alignment with the polycrystalline silicon electrodes 11a for constituting the signal charge storage section 10a and the signal charge transfer section 3a adjacent to each other. Accordingly, a channel potential below the polycrystalline silicon electrode 11b of the signal charge reading section 2a is kept uniform, and no portions (2a1, 2a2) like those shown in FIG. 14 where channel potentials are different from each other exist. Therefore, when signal charges are read from the signal charge storage section 10a through the signal charge reading section 2a to the signal charge transfer section 3a, no signal charges are left untransferable and no residual images are generated. This situation and an operation of the second embodiment will now be described.

Figure 8:
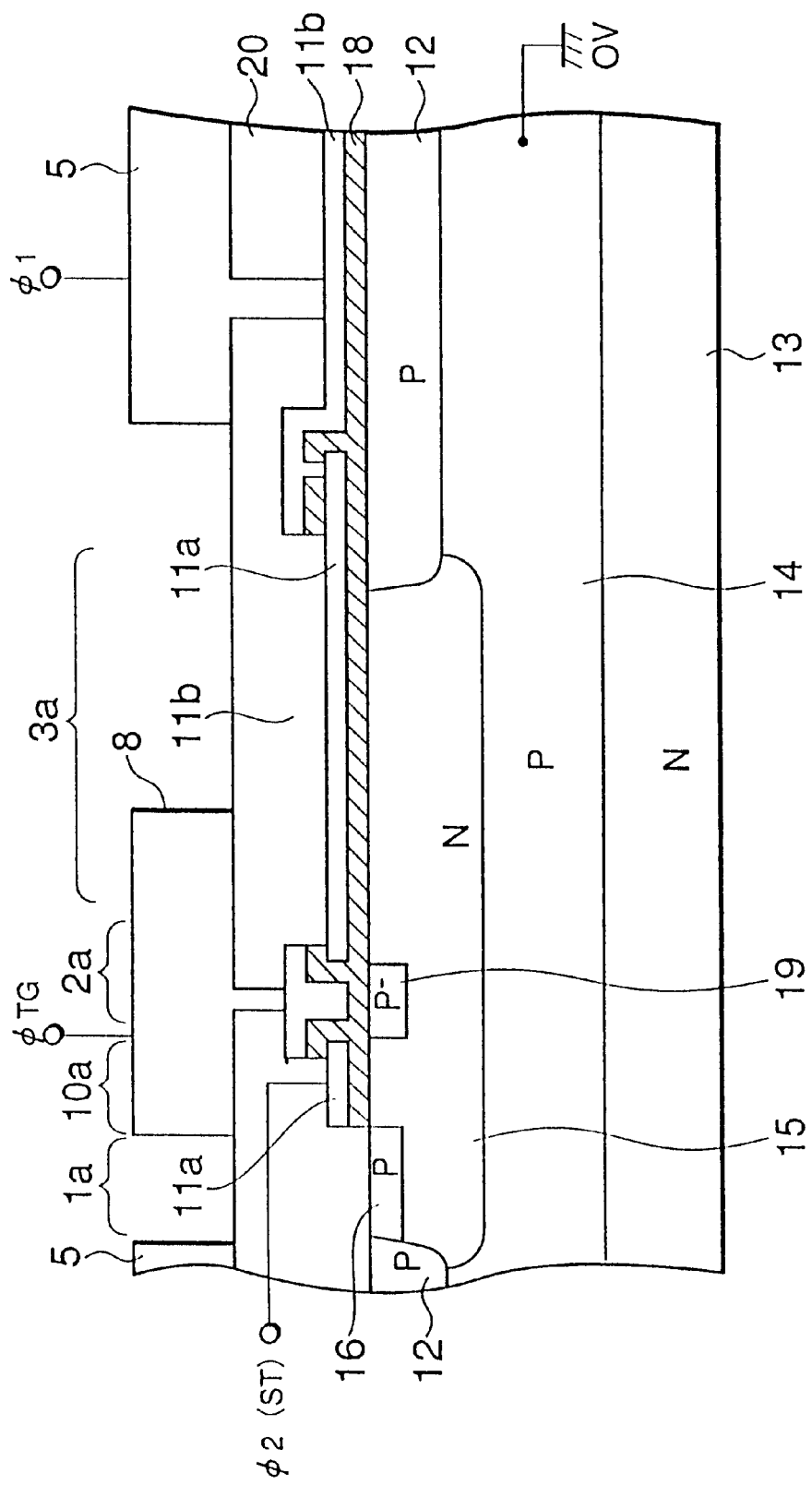
FIG. 8 is a sectional views respectively taken along lines E—E.
Figure 9:
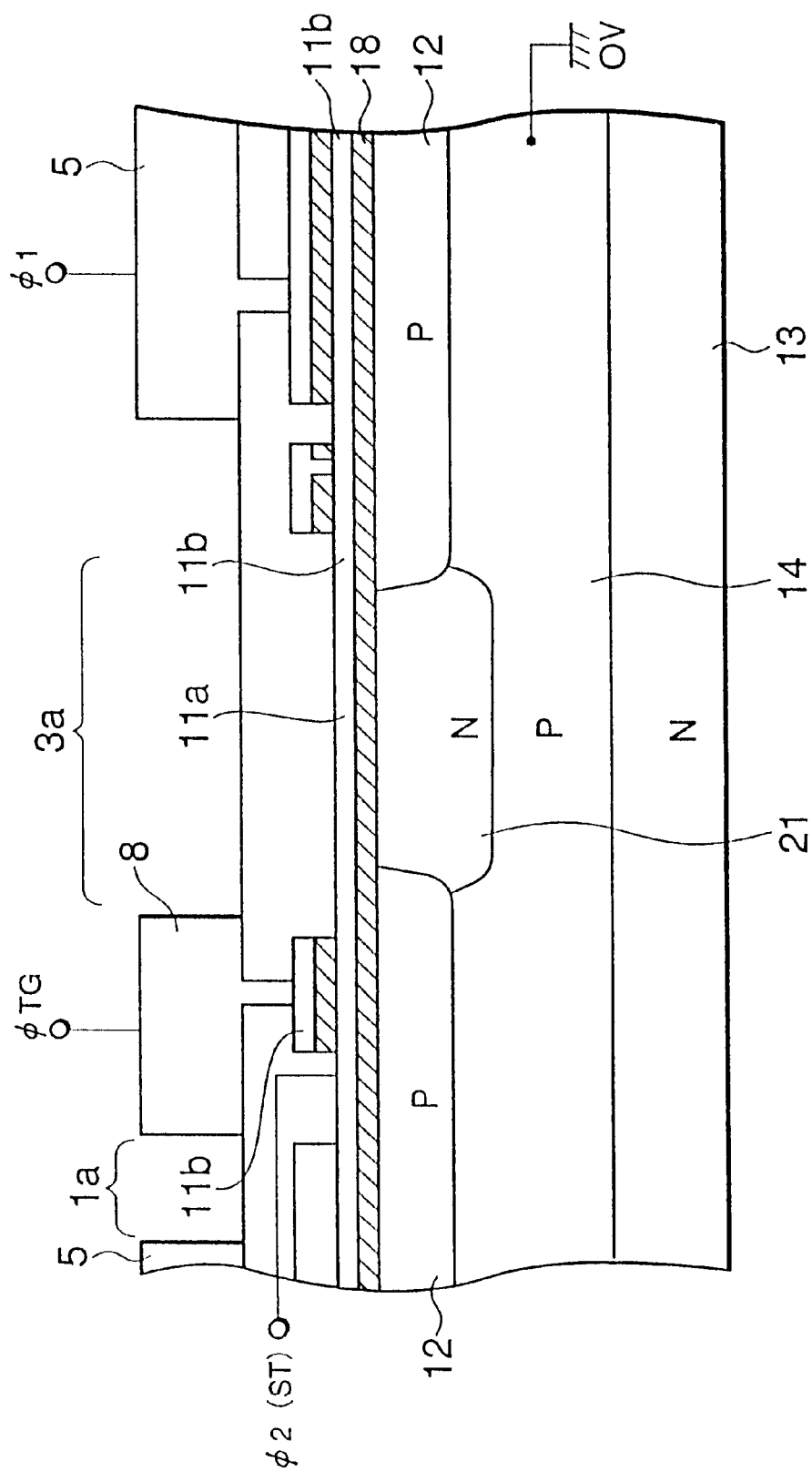
FIG. 9 is a sectional views respectively taken along lines F—F of FIG. 7.

Referring to FIG. 10, shown are a timing chart of the second embodiment shown in FIGS. 6 to 9 and channel potentials of respective portions of the sectional views of FIGS. 8 and 9 at time (t1 to t5). Lights made incident on the light receiving section 1a in a period until the time t1 are subjected to photoelectric conversion and then stored in the signal charge storage section 10a. At the time t2 (signal charges Qi), a pulse φTG applied to the polycrystalline silicon electrode 11b of the signal charge reading section 2a is changed from a LOW level to a HIGH level, and the stored signal charges Qi are transferred through the signal charge reading section 2a to the signal charge transfer section 3a. Here, below the polycrystalline silicon electrode 11b of the signal charge reading section 2a, the P-type region 19 is formed in the surface of the N-type region 21 in self-alignment with the polycrystalline silicon electrodes 11a of the signal charge storage section 10a and the signal charge transfer section 3a adjacent to each other. Accordingly, its channel potential is kept uniform. Therefore, at the time t2, no places exist where signal charges are left untransferable during transfer of the signal charges Qi from the signal charge storage section 10a to the signal charge transfer section 3a.

At the time t3 and thereafter, signal charges qi of a next line from the line subjected to photoelectric conversion in the light receiving section 1a are gradually stored in the signal charge storage section 10a (signal charge amount is proportional to storing time). In the signal charge transfer section 3a, the signal charges Qi are transferred by pulses φ1 and φ2 (ST) which have phases reverse to each other. During transfer of the signal charges (t3 to t5 and thereafter), a signal charge transfer pulse φ2 (ST) is also applied to the signal charge storage section 10a. But since unlike the case of the first embodiment, a pulse φTG applied to the signal charge reading section 2a adjacent to the signal charge storage section 10a is kept at a LOW level, no mixing occurs between the signal charges Qi to be transferred and the signal charges qi of the next line to be stored. This is attributed to the fact that because the signal charge reading section 2a has the P-type region 19 provided in the surface of the N-type region 21 as described above, if applied voltages are equal to each other, a channel potential is always lower (potential difference is VB) than that of the adjoining signal charge storage section 10 by an amount equivalent to the existence of the P-type region 19. In other words, compared with the first embodiment, the second embodiment has a limitation placed on an effective area (area of a portion of the light receiving section other than the element separation region) of the light receiving section, because the pulse line is connected with the polycrystalline silicon electrode 11a of the signal charge storage section 10 on the element separation region 12 for separating respective elements of the light receiving section 1a. However, the second embodiment is advantageous in that no timing limitations are placed between a pulse applied to the signal charge reading section 2a and a pulse applied to the signal charge storage section 10a during transfer of the signal charges.

As exemplified by the foregoing embodiments, according to an aspect of the present invention, provided is a color linear image sensor having a small line-to-line distance, which comprises on a semiconductor substrate: a plurality of light receiving section array; signal charge storage sections adjacent to the respective light receiving sections; signal charge reading sections adjacent to the signal charge storage sections; and signal charge transfer sections for transferring signal charges read by the signal charge reading sections from the signal charge storage sections to signal charge conversion sections. In this case, each of the signal charge reading sections includes an N-type (or p-type) region selectively formed in the surface of a P-type (or N-type) semiconductor well, a first P-type (or N-type) region selectively formed on the surface of the N-type (or P-type) region and an electrode formed on the first P-type (or N-type) region interposing a gate insulating film. An electrode for constituting the signal charge reading section is electrically connected with an electrode for constituting a portion of the signal charge transfer section which is adjacent to the signal charge reading section. Driving pulses for these electrodes are made common (φ1 (TG)). Not a DC voltage but a pulse is applied to an electrode for constituting the signal charge storage section.

According to another aspect of the present invention, provided is a color linear image sensor having a small line-to-line distance, which comprises on a semiconductor substrate: a plurality of light receiving section array; signal charge storage sections adjacent to the respective light receiving sections; signal charge reading sections adjacent to the signal charge storage sections; and signal charge transfer sections for transferring signal charges read by the signal charge reading sections from the signal charge storage sections to signal charge conversion sections. In this case, each of the signal charge reading sections includes an N-type (or P-type) region selectively formed in the surface of a P-type (or N-type) semiconductor well, a first P-type (or N-type) region selectively formed in the surface of the N-type (or P-type) region and an electrode formed on the first P-type (or N-type) region interposing a gate insulating film. An electrode for constituting the signal charge storage section is electrically connected with an electrode for constituting a portion of the signal charge transfer section which is not adjacent to the signal charge reading section. Not DC voltages but common driving pulses φ2 (ST) are applied to these electrodes.

Both of the color linear image sensors of the present invention are very advantageous in that residual images can be greatly reduced (to 0 in principle) while a line-to-line distance between the light receiving sections is increased only by about 12.5%.

Although the preferred embodiment of the present invention has been described in detail, it should be understood that various changes, substitutions and alternations can be made therein without departing from spirit and scope of the inventions as defined by the appended claims.

What is claimed is:

1. A color linear image sensor having a small line-to-line distance, comprising on a semiconductor substrate:

a plurality of light receiving section array;

signal charge storage sections respectively adjacent to said light receiving sections;

signal charge reading sections respectively adjacent to said signal charge storage sections; and signal charge transfer sections for transferring signal charges read by said signal charge reading sections from said signal charge storage sections to signal charge conversion sections, wherein each of said signal charge reading sections includes a first region of a second conductive type selectively formed in a surface of a semiconductor well of a first conductive type, a second region of a first conductive type selectively formed in a surface of said first region and an electrode formed on said second region interposing a gate insulating film, and said electrode of said signal charge reading section is electrically connected with an electrode for constituting a portion of said signal charge transfer section which is adjacent to said signal charge reading section;

wherein each of said signal charge transfer sections includes a two-phase driven CCD shift register;

wherein means is provided for making common driving pulses for said signal charge reading section and a portion of said two-phase driven CCD shift register which is adjacent to said signal charge reading section and applying a pulse signal to an electrode for constituting said signal charge storage section;

wherein said pulse signal applied to said electrode for constituting said signal charge storage section is set to a potential equal to or higher than a potential of first pulses except a period for reading said first pulses commonly applied to said signal charge reading section and a portion of said two-phase driven CCD register which is adjacent to said signal charge reading section and signal charges from said signal charge storage section to said signal charge transfer section.

2. A color linear image sensor having a small line-to-line distance according to claim 1, wherein each of said light receiving sections includes said first region selectively formed in the surface of said semiconductor well of the first conductive type and a third region of a first conductive type formed in the surface of said first region in self-alignment with an electrode for constituting said signal charge storage section, and a potential equal to a potential of said semiconductor well of the first conductive type is applied to said third region.

3. A color linear image sensor having a small line-to-line distance according to claim 1, wherein said second region for constituting said signal charge reading section is formed in self-alignment with an electrode constituting said signal charge storage section and an electrode constituting transfer section.

4. A color linear image sensor having a small line-to-line distance, comprising on a semiconductor substrate:

a plurality of light receiving section array signal charge storage sections respectively adjacent to said light receiving sections;

signal charge reading sections respectively adjacent to said signal charge storage sections; and signal charge transfer sections for transferring signal charges read by said signal charge reading sections from said signal charge storage sections to signal charge conversion sections, wherein each of said signal charge reading sections includes a first region of a second conductive type selectively formed in a surface of a semiconductor well of a first conductive type, a second region of the first conductive type selectively formed in a surface of said first region and an electrode formed on said second region interposing a gate insulating film, and an electrode for constituting said signal charge storage section is electrically connected with an electrode for constituting a portion of said signal charge transfer section which is not adjacent to said signal charge reading section.

5. A color linear image sensor having a small line-to-line distance according to claim 4, wherein each of said light receiving sections includes said first region selectively formed in the surface of said semiconductor well and a third region of a first conductive type formed in the surface of said first region in self alignment with said electrode for constituting said signal charge storage section, and a potential equal to a potential of said semiconductor well is applied to said third region.

6. A color linear image sensor having a small line-to-line distance according to claim 4, wherein said second region constituting said signal charge reading section is formed in self alignment with the electrode constituting said signal charge storage section and the electrode constituting said signal charge transfer section.

7. A color linear image sensor having a small line-to-line distance according to claim 4, wherein each of said signal charge transfer sections includes a two-phase driven CCD register.

8. A color linear image sensor having a small line-to-line distance according to claim 7, wherein provided is means for applying no DC voltage but applying common driving pulses to said signal charge storage section and a portion of said two-phase driven CCD shift register which is not adjacent to said signal charge reading section.

9. An image sensor comprising a light receiving section responding to an incident light and generating electric charges, a signal storage section having a first electrode formed thereover to store said electric charges generated by said light receiving section, a signal charge reading section having a second electrode formed thereover to read out said electric charges from said signal storage section, and a signal charge transfer section coupled to said signal charge reading section to transfer said electric charges in response to a transfer pulse signal supplied to a third electrode formed over said signal charge transfer section, said second electrode being electrically connected to said third electrode to receive said transfer pulse signal, and said first electrode being supplied with a clock pulse signal to vary a channel potential formed in said signal charge storage section.

10. The image sensor as claimed in claim 9, wherein said clock pulse is supplied such that said channel potential formed in said signal charge storage section becomes deeper than a channel potential formed in said signal charge reading section while said electric charges are transferred through said signal charge transfer section.

11. The image sensor as claimed in claim 10, wherein said clock pulse signal is supplied such that said channel potential formed in said signal charge storage section becomes shallower than the channel potential formed in said signal charge reading section when said electric charges are read out from said signal charge storage section to said signal transfer section through said signal charge reading section.

12. The image sensor as claimed in claim 9, further comprising a first semiconductor region of a first conductivity type and a second region of a second conductivity type selectively formed in said first region to define first and second surface portions in said first region, said charge storage section comprising said first surface portion, said signal charge reading section comprising said second region, and said signal charge transfer section comprising said second surface portion.

13. The image sensor as claimed in claim 12, wherein said first electrode is formed over said first surface portion with an intervention of a first gate insulating film, said second electrode being formed over said second region with an intervention of a second gate insulating film, and said third electrode being formed over said second surface portion with an intervention of a third gate insulating film.

* * * * *